(12) United States Patent
Hu

(10) Patent No.: US 8,564,094 B2
(45) Date of Patent: Oct. 22, 2013

(54) CAPACITORS INCLUDING AT LEAST TWO PORTIONS OF A METAL NITRIDE MATERIAL, METHODS OF FORMING SUCH STRUCTURES, AND SEMICONDUCTOR DEVICES INCLUDING SUCH STRUCTURES

(75) Inventor: Yongjun Jeff Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 411 days.

(21) Appl. No.: 12/556,266

(22) Filed: Sep. 9, 2009

(65) Prior Publication Data
US 2011/0057292 A1    Mar. 10, 2011

(51) Int. Cl.
H01L 29/94    (2006.01)

(52) U.S. Cl.
USPC ............ 257/532; 257/E29.342; 257/E29.343; 257/E21.008; 361/305; 438/396

(58) Field of Classification Search
USPC ................. 257/532, 741, E29.342, E29.343, 257/E23.01, E21.008, E21.576; 361/305; 438/396, 652
See application file for complete search history.

(56) References Cited

U.S. PATENT DOCUMENTS

| | | | |
|---|---|---|---|
| 5,981,331 A * | 11/1999 | Tsunemine | 438/240 |
| 6,511,879 B1 | 1/2003 | Drynan | |
| 6,593,616 B2 | 7/2003 | Hu et al. | |
| 6,746,916 B2 * | 6/2004 | Agarwal et al. | 438/253 |
| 6,753,618 B2 | 6/2004 | Basceri et al. | |
| 6,881,642 B2 | 4/2005 | Basceri et al. | |
| 7,071,054 B2 * | 7/2006 | Park | 438/243 |
| 7,268,072 B2 | 9/2007 | Deboer et al. | |
| 7,304,367 B2 | 12/2007 | Choi et al. | |
| 7,329,939 B2 | 2/2008 | Hsu et al. | |
| 7,368,343 B2 | 5/2008 | Yang | |
| 7,545,009 B2 | 6/2009 | Iyer et al. | |
| 7,772,678 B2 * | 8/2010 | Iwamoto et al. | 257/632 |
| 8,105,891 B2 * | 1/2012 | Yeh et al. | 438/199 |
| 2002/0019107 A1 * | 2/2002 | Lin et al. | 438/396 |
| 2002/0102810 A1 * | 8/2002 | Iizuka et al. | 438/396 |
| 2004/0206620 A1 * | 10/2004 | Wang et al. | 204/192.12 |
| 2004/0259308 A1 * | 12/2004 | Chung et al. | 438/253 |
| 2005/0087879 A1 * | 4/2005 | Won et al. | 257/758 |
| 2007/0145525 A1 | 6/2007 | Wang et al. | |
| 2008/0073708 A1 | 3/2008 | Aiso | |
| 2008/0138948 A1 * | 6/2008 | Benson | 438/253 |
| 2008/0188055 A1 | 8/2008 | Wang et al. | |
| 2010/0001325 A1 * | 1/2010 | Sashida | 257/295 |
| 2010/0025853 A1 * | 2/2010 | Lindgren et al. | 257/763 |
| 2010/0187655 A1 * | 7/2010 | Choi et al. | 257/532 |
| 2010/0213571 A1 * | 8/2010 | Dyer et al. | 257/532 |
| 2013/0011990 A1 * | 1/2013 | Bhat et al. | 438/381 |

OTHER PUBLICATIONS

Wikipedia information on "Titanium nitride" retrieved Oct. 31, 2011.*

(Continued)

*Primary Examiner* — Allan R Wilson
(74) *Attorney, Agent, or Firm* — TraskBritt

(57) ABSTRACT

Metal-insulator-metal capacitors with a bottom electrode including at least two portions of a metal nitride material. At least one of the portions of the metal nitride material includes a different material than another portion. Interconnects including at least two portions of a metal nitride material are also disclosed, at least one of the portions of the metal nitride material are formed from a different material than another portion of the metal nitride material. Methods for fabricating such MIM capacitors and interconnects are also disclosed, as are semiconductor devices including such MIM capacitors and interconnects.

25 Claims, 21 Drawing Sheets

(56) References Cited

OTHER PUBLICATIONS

Wikipedia information on "Niobium nitride" retrieved Oct. 31, 2011.*

Ma et al. Journal of Applied Physics, "X-ray diffraction study of nanocrystalline tungsten nitride and tungsten to 31 GPa" Journal of Applied Physics, section titled "Result and Discussion" published Jul. 12, 2007.*

Shinn et al, Growth, Structure, and Microhardness of Epitaxial Tin/NbN Superlattices, J. Mater. Res., vol. 7, No. 4, Apr. 1992, pp. 901-911.

Chu et al., Model of Superlattices Yield Stress and Hardness and Enhancements, J. Appl. Phys., vol. 77, No. 9, May 1, 1995, pp. 4403-4411.

Madan et al., Enhanced Mechanical Hardess in Epitaxial Nonisostructural Mo/NbN and W/NbN Superlattices, Journal of Applied Physics, vol. 84, No. 2, Jul. 15, 1998, pp. 776-785.

Nordin et al., Residual Stress Formation in Multilayered Tin/TaNx Coatings During Reactive Magnetron Sputter Deposition, J. Vac. Sci. Technol. A, vol. 18, No. 6, Nov./Dec. 2000, pp. 2884-2889.

Amorphous. Merriam-Webster.com, 2011. http://www.merriam-webster.com, 4 pages.

* cited by examiner

CAPACITORS INCLUDING AT LEAST TWO PORTIONS OF A METAL NITRIDE MATERIAL, METHODS OF FORMING SUCH STRUCTURES, AND SEMICONDUCTOR DEVICES INCLUDING SUCH STRUCTURES

TECHNICAL FIELD

The present invention, in various embodiments, relates generally to semiconductor structures including at least two portions of a metal nitride material, and methods of forming such semiconductor structures. More specifically, embodiments of the present invention relate to a metal-insulator-metal (MIM) capacitor having a bottom electrode formed from at least two portions of a metal nitride material, and methods of forming such capacitors. Additionally, the present invention relates to an interconnect including at least two portions of a metal nitride material and methods of forming such interconnects.

BACKGROUND

A dynamic random access memory (DRAM) cell typically includes a charge storage capacitor coupled to an access device such as a Metal-Oxide-Semiconductor Field Effect Transistor (MOSFET). The MOSFET functions to apply or remove charge on the capacitor, thus affecting a logical state defined by the stored charge. The conditions of DRAM operation, such as operating voltage, leakage rate and refresh rate, will, in general, mandate that a certain minimum charge be stored by the capacitor.

In the continuing trend to higher memory capacity, the packing density of storage cells must increase, yet each must maintain required capacitance levels. This is a crucial demand of DRAM fabrication technologies if future generations of expanded memory array devices are to be successfully manufactured. Nevertheless, in the trend to higher memory capacity, the packing density of cell capacitors has increased at the expense of available cell area. For example, the area allowed for a single cell in a 64-Mbit DRAM is only about 1.4 $\mu m^2$. In such limited areas, it is difficult to provide sufficient capacitance using conventional stacked capacitor structures. As a result, features of the DRAM cell may be formed with high aspect ratios (i.e., the ratio of height to width). These high aspect ratios can decrease the stability of such features causing the features to wobble or wave and may damage the cell.

Similarly, as the size of storage cells decreases, interconnects, such as bit lines and wordlines, may decrease in size, e.g., width, while also being relied upon to provide support to the features in the storage cell.

Accordingly, there is a need for a method of forming an MIM capacitor having increased stability and strength without increasing the size of the MIM capacitor, as well as a method of forming an interconnect and a wordline with increased strength to add support to components of a memory cell.

DETAILED DESCRIPTION

Figure 1:
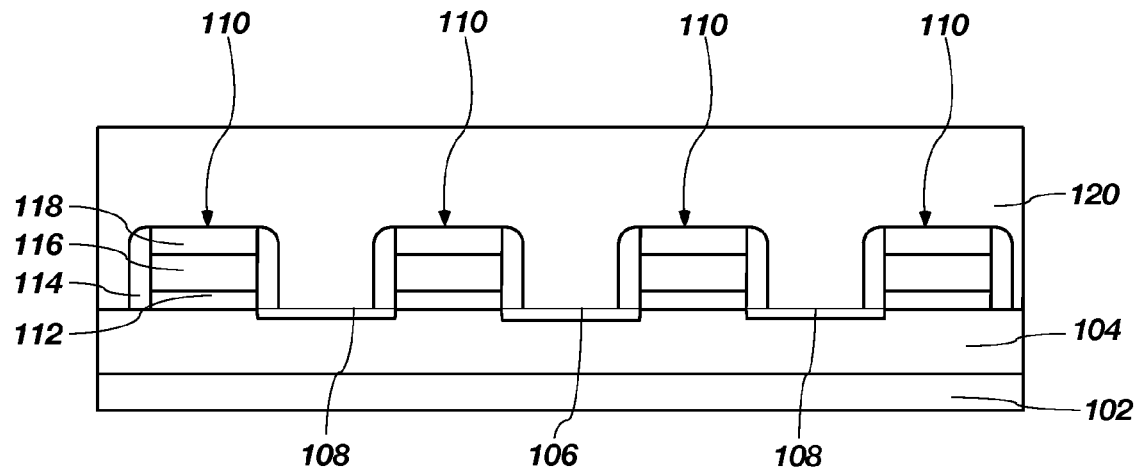
FIGS. 1-11 are cross-sectional views of a semiconductor device including a MIM capacitor during various processing acts in accordance with one embodiment of the present invention.

A MIM capacitor including a high-strength bottom electrode and methods of forming such a MIM capacitor are disclosed. The bottom electrode includes at least two portions of a metal nitride material. At least one of the portions of the bottom electrode is formed from a different metal nitride material than another portion of the bottom electrode. As used herein, the term "portion" means and includes a part of the bottom electrode having different properties than another part of the bottom electrode. For example, the portions of the bottom electrode may differ from one another in chemical composition, such as differing in the metal of the metal nitride material or differing in the ratio of the metal-to-nitrogen in the metal nitride material. While the portions of the bottom electrode may not be visually distinct from one another, the portions of the bottom electrode may be chemically distinct. Due to the differences in chemical composition, the portions of the bottom electrode may differ from one another in one or more of the following properties: conductivity, resistance, optical properties, Young's modulus, hardness, or barrier properties. The strength of the bottom electrode may help prevent potential deformation in the MIM capacitor. An interconnect including at least two portions of the metal nitride material and methods of forming such an interconnect are also disclosed. As described above with respect to a MIM capacitor, the portions of the interconnect may differ from one another in chemical composition. The interconnect may include, but is not limited to, a bit line or a wordline. The strength of the bottom electrode may help prevent potential deformation of the interconnect.

The following description provides specific details, such as material types, material thicknesses, and processing conditions in order to provide a thorough description of embodiments of the present invention. However, a person of ordinary skill in the art would understand that the embodiments of the present invention may be practiced without employing these specific details. Indeed, the embodiments of the present invention may be practiced in conjunction with conventional fabrication techniques employed in the industry. In addition, the description provided below does not form a complete process flow for manufacturing a semiconductor device. The semiconductor device structures described below do not form a complete semiconductor device. Only those process acts and structures necessary to understand the embodiments of the present invention are described in detail below. Additional acts to form the complete semiconductor device from the intermediate semiconductor device structures may be performed by conventional fabrication techniques.

The materials of the MIM capacitors and interconnects described herein may be formed by any suitable technique including, but not limited to, spin coating, blanket coating, chemical vapor deposition ("CVD"), atomic layer deposition ("ALD"), plasma enhanced ALD, or physical vapor deposition ("PVD"). Alternatively, the materials may be grown in situ. Depending on the specific material to be formed, the technique for depositing or growing the material may be selected by a person of ordinary skill in the art. While the materials described and illustrated herein may be formed as layers, the materials are not limited thereto and may be formed in other three-dimensional configurations.

In the following detailed description, reference is made to the accompanying drawings, which form a part hereof, and in which is shown, by way of illustration, specific embodiments in which the invention may be practiced. These embodiments are described in sufficient detail to enable a person of ordinary skill in the art to practice the invention. However, other embodiments may be utilized, and structural, logical, and electrical changes may be made without departing from the scope of the invention. The illustrations presented herein are not meant to be actual views of any particular MIM capacitor, interconnect, DRAM device, or semiconductor device but are merely idealized representations that are employed to describe the present invention. The drawings presented herein are not necessarily drawn to scale. Additionally, elements common between drawings may retain the same numerical designation.

In each portion of the metal nitride material, the metal of the metal nitride material may be a refractory metal, such as tungsten (W), molybdenum (Mo), niobium (Nb), tantalum (Ta), rhenium (Re), titanium (Ti), vanadium (V), chromium (Cr), zirconium (Zr), or hafnium (Hf). The metal nitride material may include, but is not limited to, $W_xN_y$, $Mo_xN_y$, $Nb_xN_y$, $Ta_xN_y$, $Re_xN_y$, $Ti_xN_y$, $V_xN_y$, $Cr_xN_y$, $Zr_xN_y$, or $Hf_xN_y$, where each of x and y may be between 0 and 1, or may be an integer greater than 1. For simplicity and convenience, the metal nitride materials are referred to herein as WN, MoN, NbN, TaN, ReN, TiN, VN, CrN, ZrN, or HfN. For example, in the case of WN, the term "WN" includes WN, $W_2N$, or $WN_2$. The refractory metal and nitrogen may be present in the metal nitride material in any ratio that provides a stable metal nitride material. By way of non-limiting example, the metal nitride material may be metal rich, or may include a stoichiometric ratio of the refractory metal and nitrogen. The nitrogen in the metal nitride material may be homogenously distributed throughout the portion of the metal nitride material. Alternatively, the portion of the metal nitride material may include a gradient of nitrogen therethrough. In addition, adjacent portions of the metal nitride material may include a gradient of nitrogen at an interface of two portions.

By utilizing different materials for the portions of the metal nitride material, a superlattice may be produced. The superlattice may be produced by forming a second metal nitride material over and in contact with a first metal nitride material. The portions of the metal nitride material that constitute the bottom electrode or interconnect may be positioned upon one another in a stacked configuration, such that an underlying portion of the first metal nitride material is in intimate contact with an overlying portion of the second metal nitride material. As the second metal nitride material is deposited, the crystal structure or texture of the second metal nitride material may be substantially similar to the crystal structure of the first metal nitride material. The superlattice of the metal nitride materials may form as long as there is less than an approximately 30% mismatch (i.e., an approximately 70% identity) between the crystal structures of the two metal nitride materials. Even though the intrinsic or natural crystal structures of the two metal nitride materials are different from one another when single layers of the metal nitride materials are produced, by forming the second metal nitride material in contact with the first metal nitride material, the second metal nitride material may be grown to exhibit the same crystal structure as the first metal nitride material. By forming a superlattice of the metal nitride materials, the resulting bottom electrode or interconnect has improved hardness, which decreases its waving or wobbling, and thus helps prevent potential deformation of the bottom electrode, interconnect, and surrounding structures. In addition, bonding may occur at the interface of the two portions of the metal nitride materials, increasing the hardness of the bottom electrode or interconnect. The superlattice formed from the first refractory metal nitride material and the second refractory metal nitride material may also improve the thermal stability of the bottom electrode or interconnect.

Referring now to the drawings, where like elements are designated by like reference numerals, FIGS. 1 through 11 are cross-sectional views of a method of forming an embodiment of a semiconductor device 101 (FIG. 11) including a MIM capacitor 100 (FIG. 11) of the present invention. FIG. 1 depicts a memory cell construction for a DRAM device at an intermediate stage of fabrication, in which a pair of memory cells having respective access transistors is formed on a substrate 102. Substrate 102 may include a conventional silicon substrate or other bulk substrate including a layer of semiconductor material. As used herein, the term "bulk substrate" includes not only silicon wafers, but also silicon-on-insulator ("SOI") substrates, silicon-on-sapphire ("SOS") substrates, epitaxial layers of silicon on a base semiconductor foundation, and other semiconductor or optoelectronics materials, such as silicon-germanium, germanium, gallium arsenide, and indium phosphide. The substrate may be doped or undoped. The substrate 102 may include a well 104, which is doped with a p-type or n-type dopant depending on whether NMOS or PMOS transistors are to be formed therein. Drain regions 106, source regions 108, and wordlines or gate stacks 110 may be formed on the substrate 102 according to conventional semiconductor processing techniques, which are not described in detail herein. By way of non-limiting example, the drain regions 106 may be shallow trench isolation regions. The gate stacks 110 may include a gate oxide region 112, a conductive gate region 116, spacers 114, and a cap 118. By way of non-limiting example, the access transistor may be a recess access device (RAD).

Figure 2:
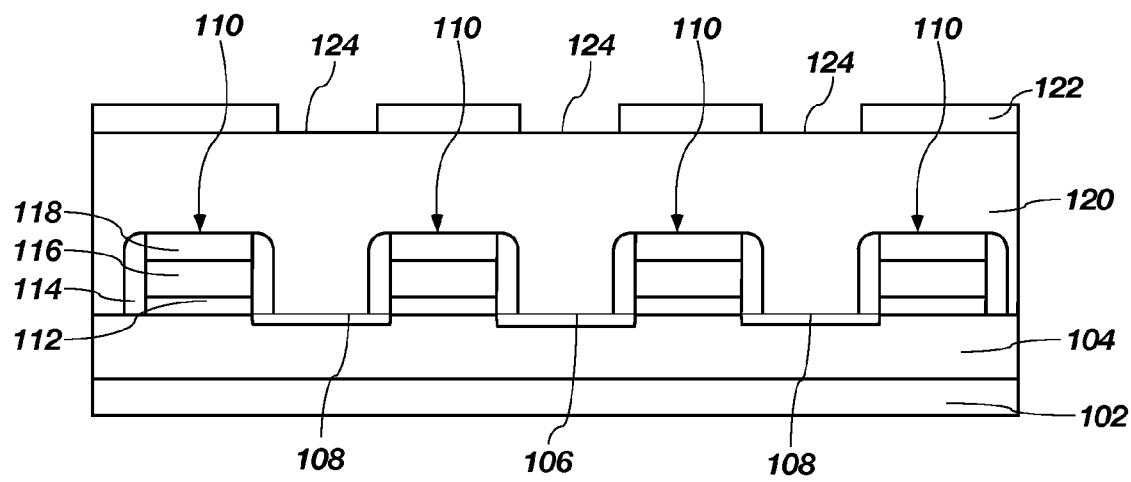
Figure 3:
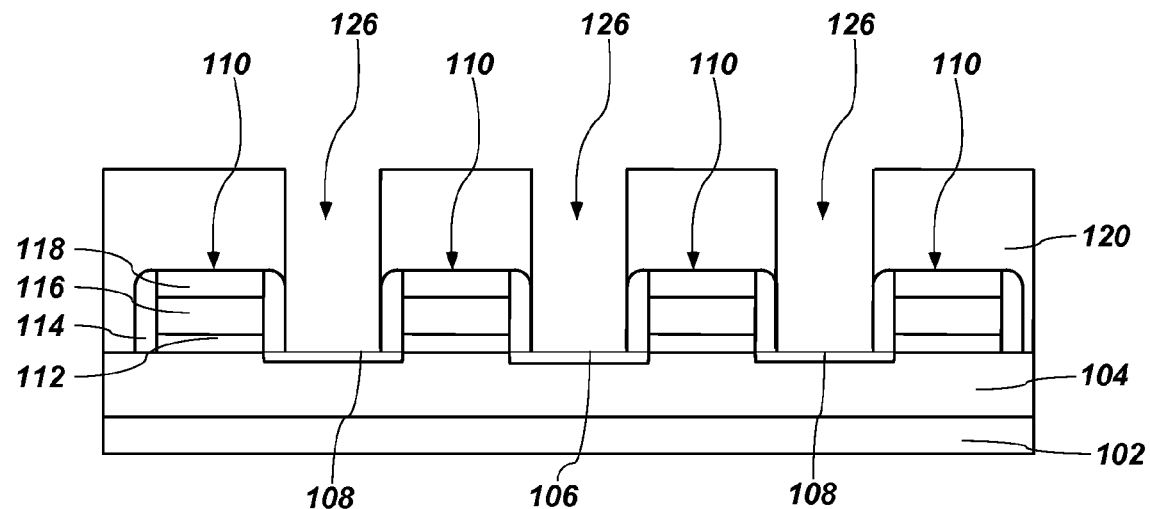
Figure 4:
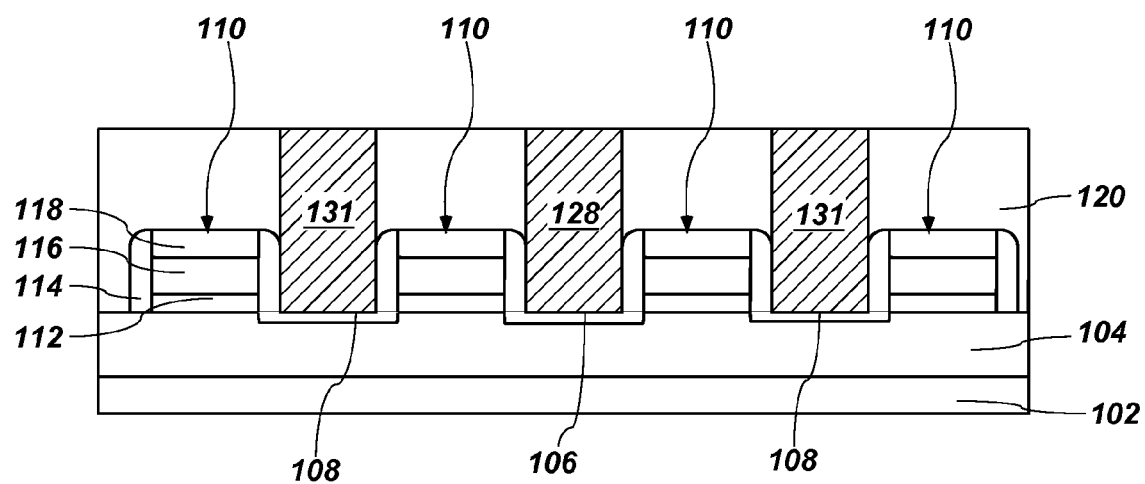
Figure 5:
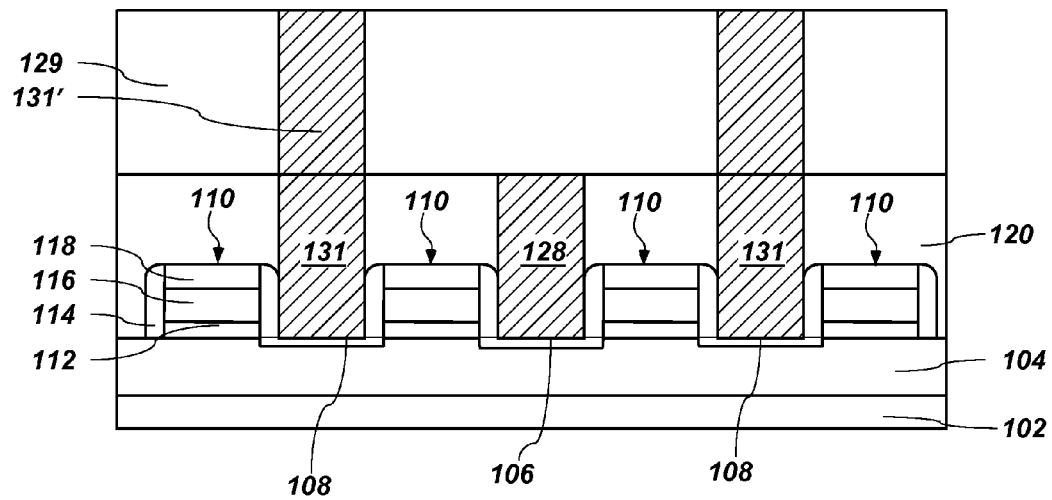

A first insulating material 120 may be formed over the drain regions 106, the source regions 108, and the gate stacks 110. The first insulating material 120 may be any insulative material known in the art, such as silicon oxide, silicon nitride, silicon oxynitride, a spin-on glass (SOG), a phosphosilicate glass (PSG), tetraethyl orthosilicate (TEOS), or borophosphosilicate glass (BPSG). As shown in FIG. 2, a photoresist material 122 may be formed over the first insulating material 120 and patterned using conventional photolithographic techniques, which are not described in detail herein. After patterning, initial openings 124 may be formed in the photoresist material 122 for subsequent etching of the first insulating material 120. As shown in FIG. 3, the insulating material 120 may be etched through the initial openings 124 to form contact openings 126, and the photoresist material 122 removed. The contact openings 126 may expose the source/drain regions 106, 108 positioned between two gate stacks 110. In FIG. 4, the contact openings 126 may be filled with a conductive material, such as doped polysilicon, that is planarized down to or near the planar surface of the first insulating material 120, to form a bit contact 128 and a first capacitor contact 131. In FIG. 5, a second insulating material 129 may be formed over the first insulating material 120 and the bit contact 128. The second insulating material 129 may be, for example, a silicon oxide, a silicon nitride, borophosphosilicate glass (BPSG), borosilicate glass (BSG), phosphosilicate glass (PSG), or tetraethyl orthosilicate (TEOS). By way of non-limiting example, the second insulating material 129 may be formed over a bitline (not shown), which may be patterned and formed in contact with the bit contact 128. The second insulating material 129 may be patterned and etched as described above and known in the art and then filled with a conductive material to form a second capacitor contact 131' contacting the first capacitor contact 131.

Figure 6:
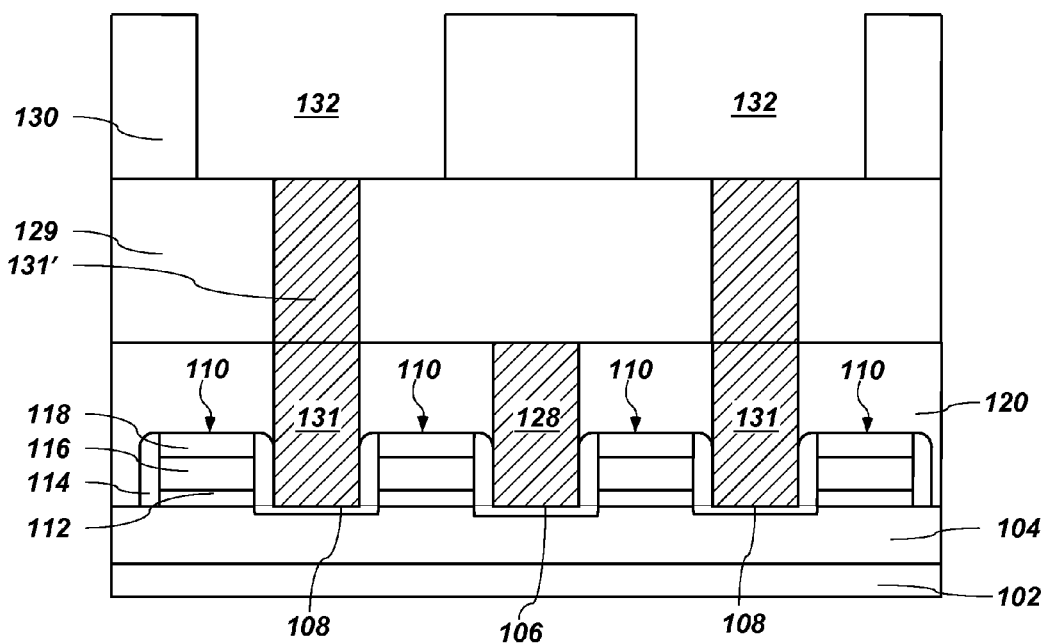
Figure 7:
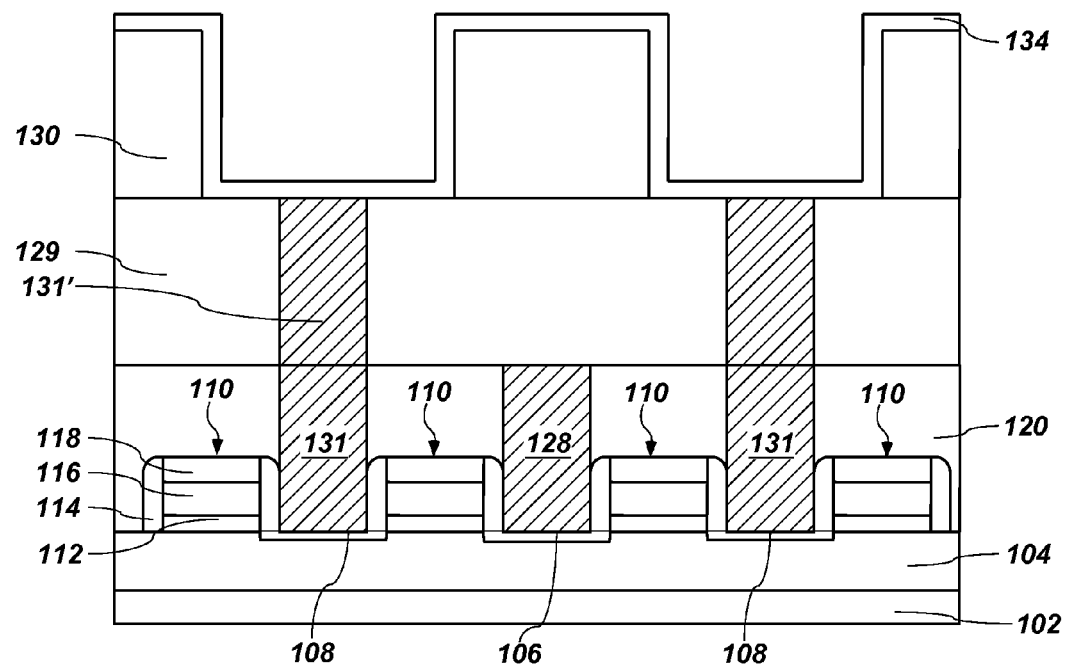

In FIG. 6, a third insulating material 130 may be formed over the second insulating material 129. The third insulating material 130 may be, for example, a silicon oxide, a silicon nitride, borophosphosilicate glass (BPSG), borosilicate glass (BSG), phosphosilicate glass (PSG), or tetraethyl orthosilicate (TEOS). As shown in FIG. 6, a capacitor opening 132 may be formed through the third insulating material 130, exposing the second capacitor contact 131'. The capacitor opening 132 may be formed using conventional techniques, which are not described in detail herein. The capacitor opening 132 may have a high aspect ratio, such as an aspect ratio of greater than approximately 30:1, such as greater than approximately 40:1. The capacitor opening 132, and hence MIM capacitor 100 (FIG. 11) may have any geometry including, but not limited to, a square or a circular shape. In FIG. 7, a first metal nitride material 134 may be conformally formed over the exposed horizontal and vertical surfaces of the third insulating material 130 and into the capacitor opening 132 overlying the second capacitor contact 131'. In one embodiment, the first metal nitride material 134 is formed from titanium nitride (TiN) because titanium nitride has good adherence or adhesion to many materials, such as to the material used as the third insulating material 130. Titanium nitride is also an extremely hard material, is almost chemically inert (although it dissolves readily in hydrofluoric acid), and is an excellent conductor. Titanium nitride also has a high melting point (about 3000° C.), which makes it unaffected by high processing temperatures. Titanium nitride also makes excellent ohmic contact with other conductive materials. Titanium nitride is also commonly used in semiconductor fabrication and, therefore, may easily be incorporated into conventional fabrication processes. However, other metal nitrides may also be used as the first metal nitride material 134.

The first metal nitride material 134 may be formed by a deposition technique known in the art, such as, for example, atomic layer deposition (ALD), chemical vapor deposition (CVD), or plasma vapor deposition (PVD). If the first metal nitride material 134 is formed by CVD, the CVD process may use a refractory metal source and a nitrogen source as precursors. CVD processes for producing metal nitride materials are known in the art and, therefore, are not described in detail herein. By way of non-limiting example, if the first metal nitride material 134 is to be formed from titanium nitride, the refractory metal source may include, for example, a titanium source precursor containing chlorine (Cl), such as titanium tetrachloride ($TiCl_4$), titanium trichloride ($TiCl_3$), bis(cyclopentadienyl)titanium dichloride (($C_5H_5)_2TiCl_2$), or cyclopentadienyltitanium trichloride (($C_5H_5)TiCl_3$). The nitrogen source may include, for example, ammonia ($NH_3$). The CVD process may be conducted at a relatively low temperature, such as from about 25° C. to about 550° C.

If the first metal nitride material 134 is formed by ALD, the ALD process may utilize a first species precursor including a refractory metal source and the first species precursor may be flowed into the capacitor opening 132. A monolayer of the refractory metal may be deposited over the exposed horizontal and vertical surfaces of the third insulating material 130 and into the capacitor opening 132. A second species precursor including nitrogen may then be flowed over the monolayer of the refractory metal, forming a monolayer of nitrogen. The monolayer of nitrogen may react with the monolayer of the refractory metal to form the metal nitride material 134. The first and second species precursors may be flowed into the capacitor opening 132 in repeated cycles until the desired thickness of the first metal nitride material 134 is achieved. ALD processes for producing metal nitride materials are known in the art and, therefore, are not described in detail herein. If the first metal nitride material 134 is to be formed from titanium nitride, the first species precursor may be titanium tetrachloride ($TiCl_4$) and the second species precursor may be ammonia ($NH_3$).

Figure 8:
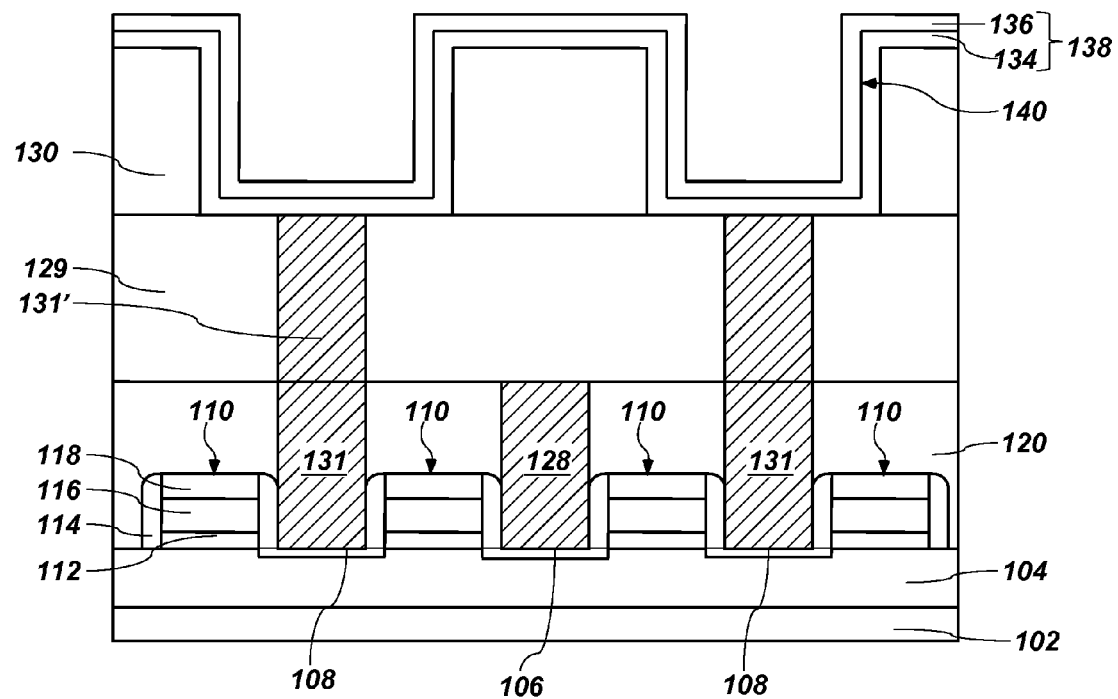

As shown in FIG. 8, a second metal nitride material 136 may be conformally formed in contact with the first metal nitride material 134. The second metal nitride material 136 may be formed in substantially the same manner as discussed above regarding the first metal nitride material 134, such as by CVD, PVD, or ALD. The second metal nitride material 136 may be formed from a different material than the first metal nitride material 134. Although the two materials are different and would be expected to have different crystal structures, intrinsic to the specific materials used, the second metal nitride material 136 may, unexpectedly, have the same crystal structure of the first metal nitride material 134. When the second metal nitride material 136 is formed over the first metal nitride material 134, the second metal nitride material 136 may adopt the crystal structure of the first metal nitride material 134, as described above, forming a superlattice. The growth of the second metal nitride material 136 may be controlled by adjusting the deposition conditions, such as by controlling either the temperature or the flow rate of the materials, so that the second metal nitride material as formed has substantially the same crystal structure as the first metal nitride material.

The first metal nitride material 134 and the second metal nitride material 136 may form portions of a bottom electrode 138. In one embodiment, the first metal nitride material 134 is titanium nitride (TiN) and the second metal nitride material 136 is tungsten nitride (WN). In another embodiment, the first metal nitride material 134 is titanium nitride (TiN) and the second metal nitride material 136 is niobium nitride (NbN). In another embodiment, the first metal nitride material 134 is titanium nitride (TiN) and the second metal nitride material 136 is tantalum nitride (TaN). In another embodiment, the first metal nitride material 134 is niobium nitride (NbN) and the second metal nitride material 136 is tantalum nitride (TaN). While the bottom electrode 138 is illustrated in FIG. 8 as including two portions of first and second metal nitride materials 134, 136, the bottom electrode 138 may include three or more portions of the metal nitride materials. Using a greater number of portions of the metal nitride materials may increase the hardness or strength of the bottom electrode 138. If three or more portions are used, at least one of the portions of the bottom electrode 138 may include a different metal nitride material than another, adjacent portion of the bottom electrode 138.

The first metal nitride material 134 and the second metal nitride material 136 may bond at an interface 140, thus providing increased hardness or strength to the bottom electrode 138. The interface 140 between the first metal nitride material 134 and the second metal nitride material 136 may include a gradient of the materials used. Since the bottom electrode 138 is a superlattice structure, the bottom electrode 138 may be at least twice as hard as a bottom electrode formed from a single refractory metal or a single refractory metal nitride. For example, using a conventional nanoindentation test, the average displacement (nm)/load (mN) of a blanket film of tungsten metal (W) was determined to be about three times greater than the average displacement (nm)/load (mN) of a blanket film of a tungsten nitride (WN) and niobium nitride (NbN) superlattice. Therefore, the hardness of the tungsten nitride (WN) and niobium nitride (NbN) superlattice is about three times greater than that of the tungsten metal (W).

The thickness of each of the first metal nitride material 134 and the second metal nitride material 136 may be from about 5 Å to about 300 Å, such as from about 10 Å to about 40 Å, and further such as from about 20 Å to about 30 Å. The thickness of each of the first metal nitride material 134 and the second metal nitride material 136 may be from about 10 Å to about 15 Å as long as the first metal nitride material 134 and the second metal nitride material 136 are formed as continuous layers or other three-dimensional configurations. By way of non-limiting example, the thickness of the first metal nitride material 134 may be about 20 Å and the thickness of the second metal nitride material 136 may be about 20 Å, forming a bottom electrode 138 having a thickness of about 40 Å. While it may be possible to form each of the first metal nitride material 134 and the second metal nitride material 136 at a thickness of about 10 Å, the first and second metal nitride materials 134, 136 should be of sufficient thickness to form the superlattice, thus providing the desired hardness to the bottom electrode 138. The resulting bottom electrode 138 may have a higher hardness or Young's modulus compared to a bottom electrode of the same thickness and formed from a single metal nitride material. Because the bottom electrode 138 has an increased hardness, the bottom electrode 138 may help prevent potential deformation of the third insulating material 130 and the MIM capacitor 100 (FIG. 11) caused by waving or wobbling. In addition, because the capacitor opening 132 has a high aspect ratio, as previously described, the bottom electrode 138 formed in the capacitor opening 132 may have a small critical dimension, such as, for example, less than about 45 nm.

In an embodiment where the refractory metal of the first metal nitride material 134 is TiN and the refractory metal of the second metal nitride material 136 is WN, the growth of the WN material may be controlled by adjusting the flow rate of nitrogen so that the WN material is formed as almost a single crystal structure along the (111) direction of the TiN material. The resulting superlattice may also have improved thermal stability compared to that of a single metal nitride material, such as WN. When a blanket film of WN is exposed to a processing temperature greater than about 750° C., the WN material may denude to W. However, when WN is formed in contact with TiN, forming a superlattice, the WN remains as WN even after repeated exposure to a processing temperature of about 850° C. The superlattice may also help prevent charge leakage through the bottom electrode 138.

Figure 9:
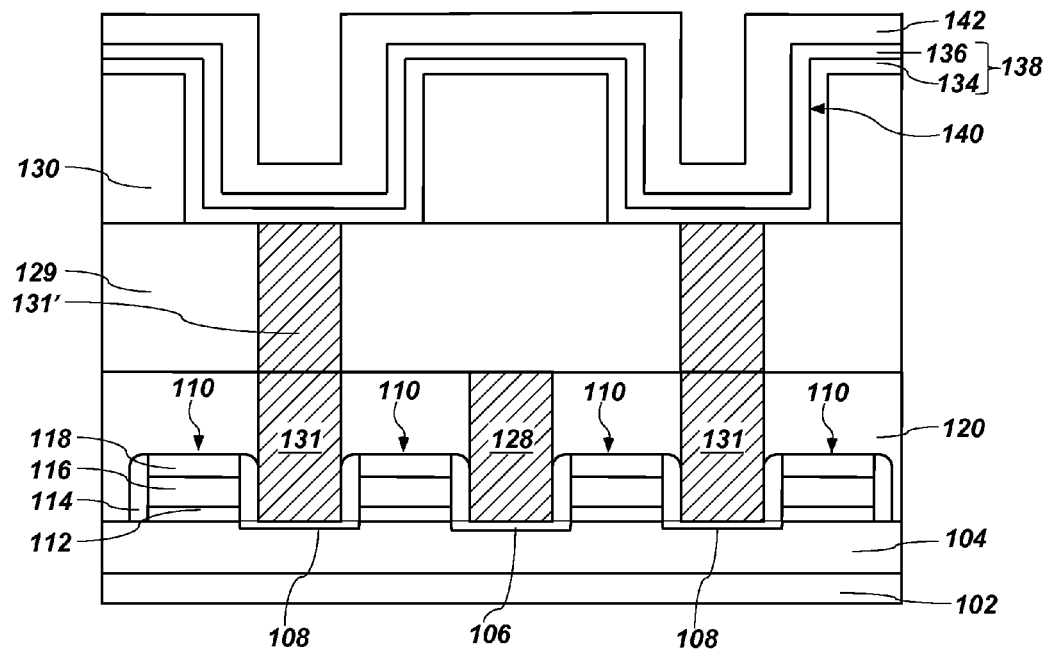
Figure 10:
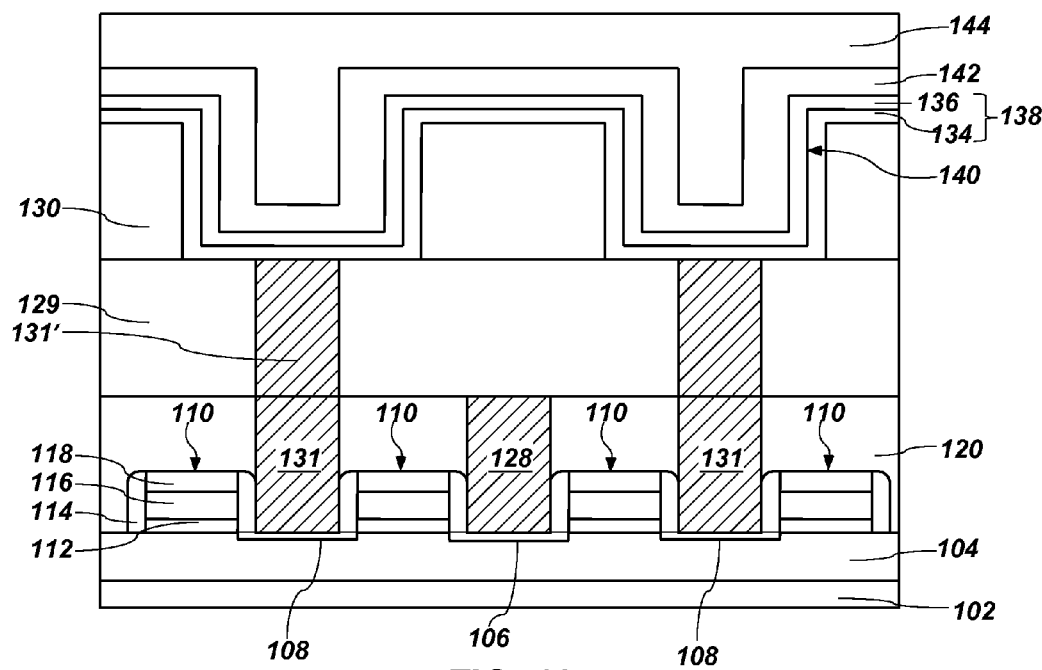
Figure 11:
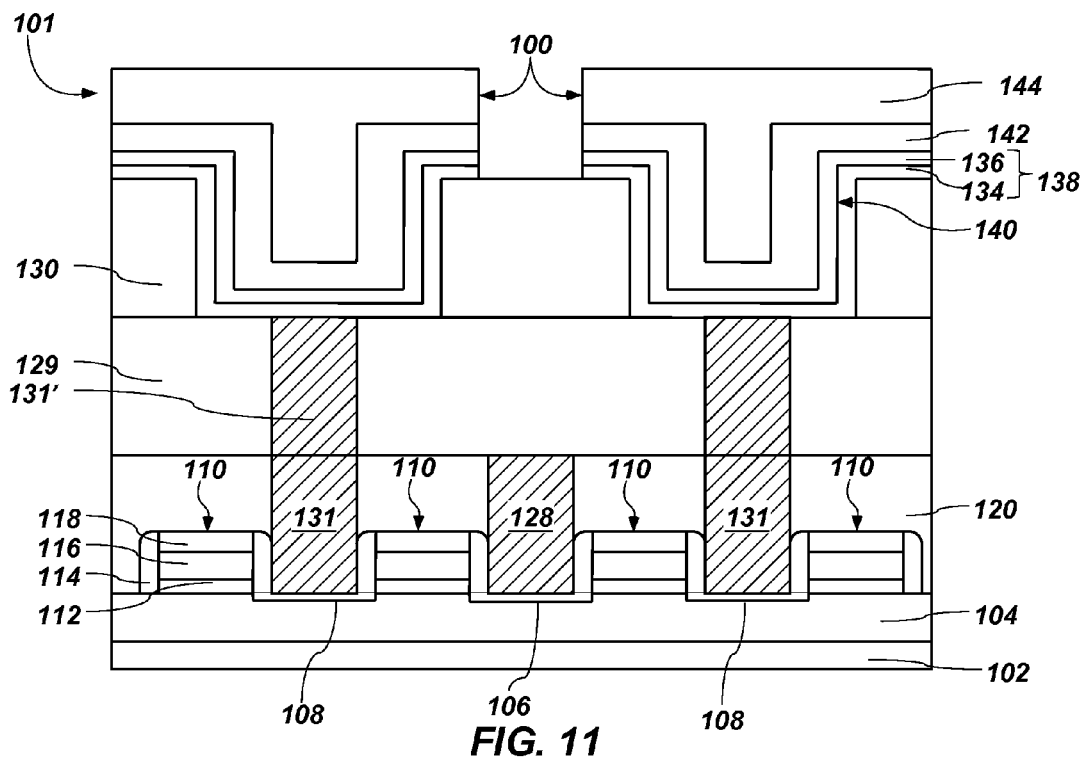

As shown in FIG. 9, a dielectric material 142 may be conformally formed over the second refractory metal nitride material 136. The dielectric material 142 may be formed from aluminum oxide ($Al_2O_3$), tantalum oxide ($Ta_2O_5$), zirconium oxide ($ZrO_2$), or hafnium oxide (HfO), as well as other dielectric materials known in the art. The dielectric material 142 may be formed by any deposition technique known in the art, such as sputtering, CVD, or PVD. In FIG. 10, a top electrode 144 may be formed in contact with the dielectric material 142. The top electrode 144 may be formed from any conductive material, such as, for example, a metal nitride. The top electrode 144 may be formed by any method known in the art, such as sputtering, CVD, or PVD. The top electrode 144 may also contain a plurality of portions of metal nitride materials, such as, for example, a first metal nitride material and a second metal nitride material, as described above regarding the bottom electrode 138. The bottom electrode 138, the dielectric material 142, and the top electrode 144 may be patterned to produce the MIM capacitor 100 of the semiconductor device 101, as shown in FIG. 11. Further processing acts, which are conventional and are not described in detail herein, may then be conducted to produce an operable semiconductor device containing the MIM capacitor 100.

Figure 12:
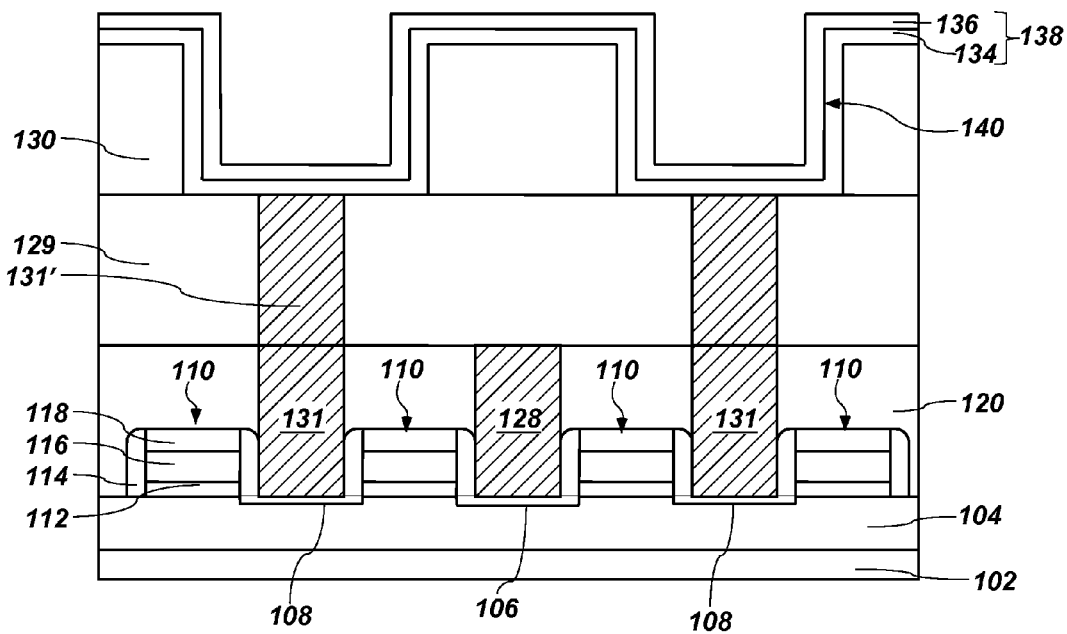
FIGS. 12-19 are cross-sectional views of a semiconductor device including a MIM capacitor during various processing acts in accordance with another embodiment of the present invention.

FIGS. 12 through 19 are cross-sectional views of a method of forming another embodiment of a semiconductor device 201 (FIG. 19) including a MIM capacitor 200 (FIG. 19) of the present invention. FIG. 12 is a substantial duplication of FIG. 8 and may be formed as described above regarding FIGS. 1 through 8. As shown in FIG. 12, the second metal nitride material 136 may be formed in contact with the first metal nitride material 134, forming the interface 140 therebetween. The second metal nitride material 136 may be conformally formed over the first metal nitride material 134.

Figure 13:
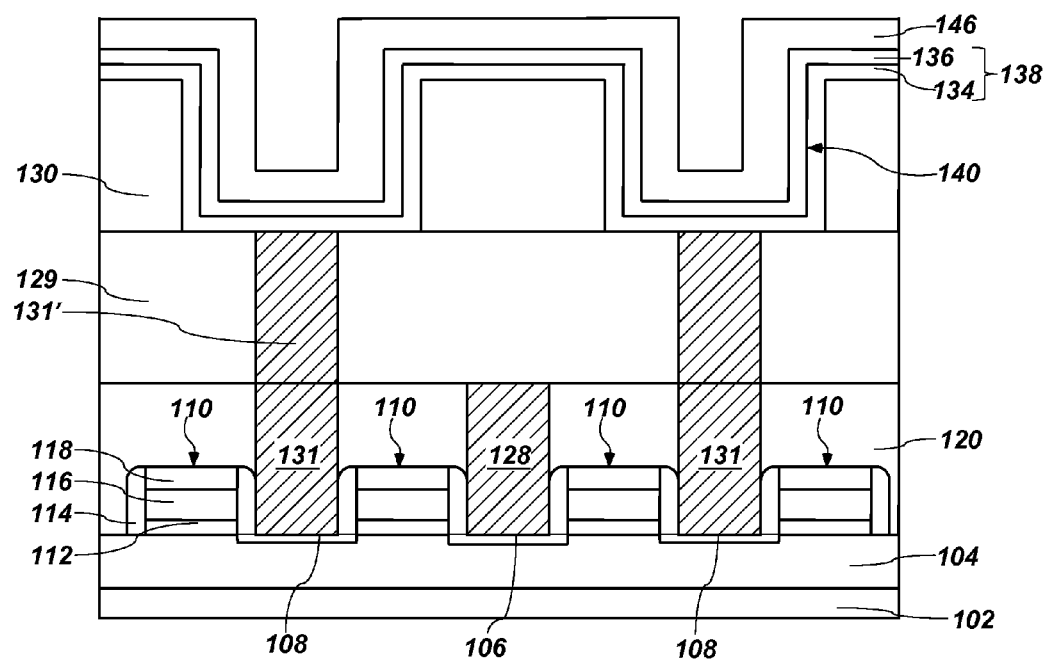
Figure 14:
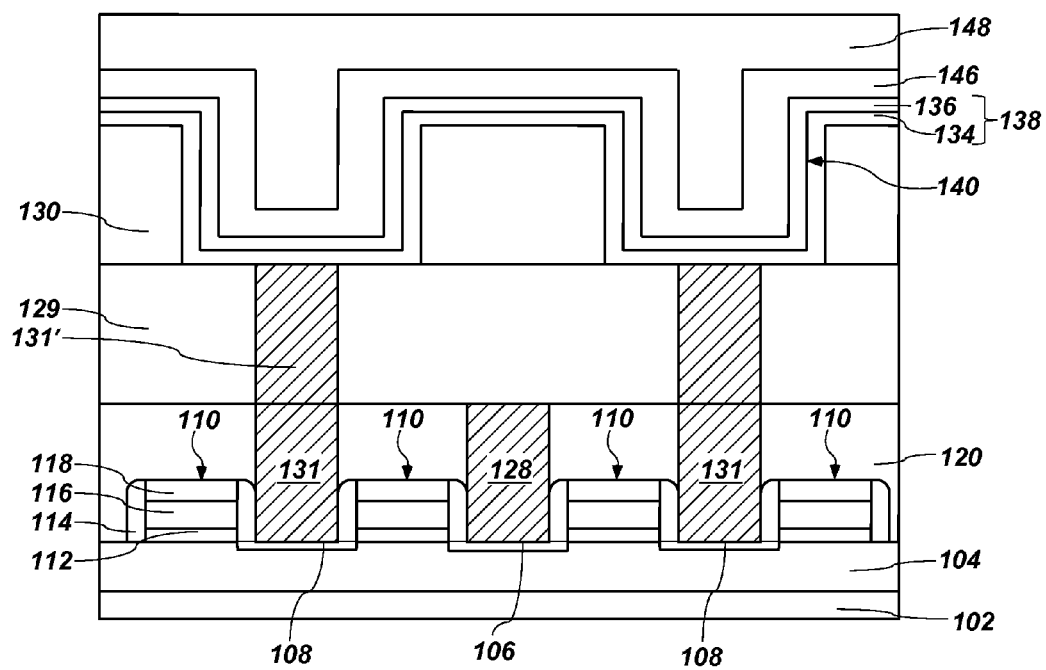

In FIG. 13, a third metal nitride material 146 may be conformally formed over the second metal nitride material 136. The third metal nitride material 146 may be formed from a different material than the second metal nitride material 136. By way of example, the third metal nitride material 146 may be formed from the same material as the first metal nitride material 134. However, the third metal nitride material 146 may also be formed from a different material than either the first or second metal nitride material 134, 136, respectively. A fourth metal nitride material 148 may be conformally formed over the third metal nitride material 146, as shown in FIG. 14. The fourth metal nitride material 148 may be formed from a different material than the material of the third metal nitride material 146. However, the fourth metal nitride material 148 may also be formed from a different material than either the first, second, or third metal nitride materials 134, 136, 146, respectively. By way of non-limiting example, the fourth metal nitride material 148 may be formed from the same material as the first metal nitride material 134 or the second metal nitride material 136. The materials used for each of the first, second, third, and fourth metal nitride materials 134, 136, 146, 148, respectively, may be selected such that adjacent metal nitride materials are formed from different materials. The materials used for each of the first, second, third, and fourth metal nitride materials 134, 136, 146, 148, respectively, may be one of the materials previously described. Each of the third metal nitride material 146 and the fourth metal nitride material 148 may be formed in the same manner as the first metal nitride material 134 and the second metal nitride material 136, as previously described, such that the interface 140 is formed between each adjacent metal nitride material 134, 136, 146, 148, respectively. Each of the metal nitride materials 134, 136, 146, 148 may have a thickness of from about 10 Å to about 40 Å, as previously described. The metal nitride materials 134, 136, 146, 148 may form a superlattice. While FIG. 14 is illustrated as having four metal nitride materials 134, 136, 146, 148, any number of materials may be used to substantially fill the capacitor opening 132 (FIG. 6).

Figure 15:
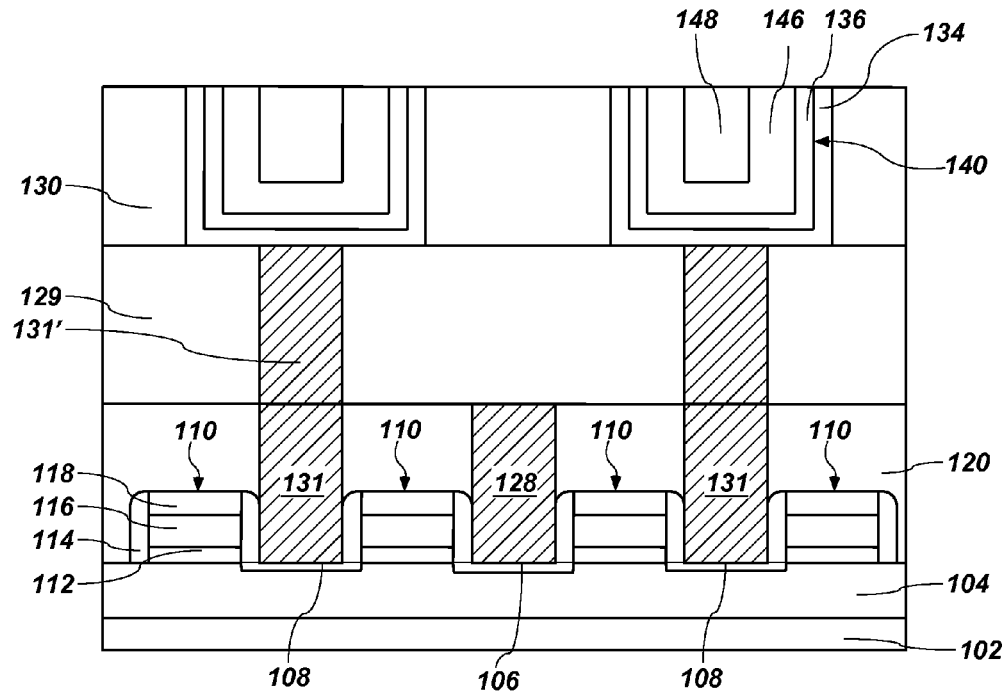
Figure 16:
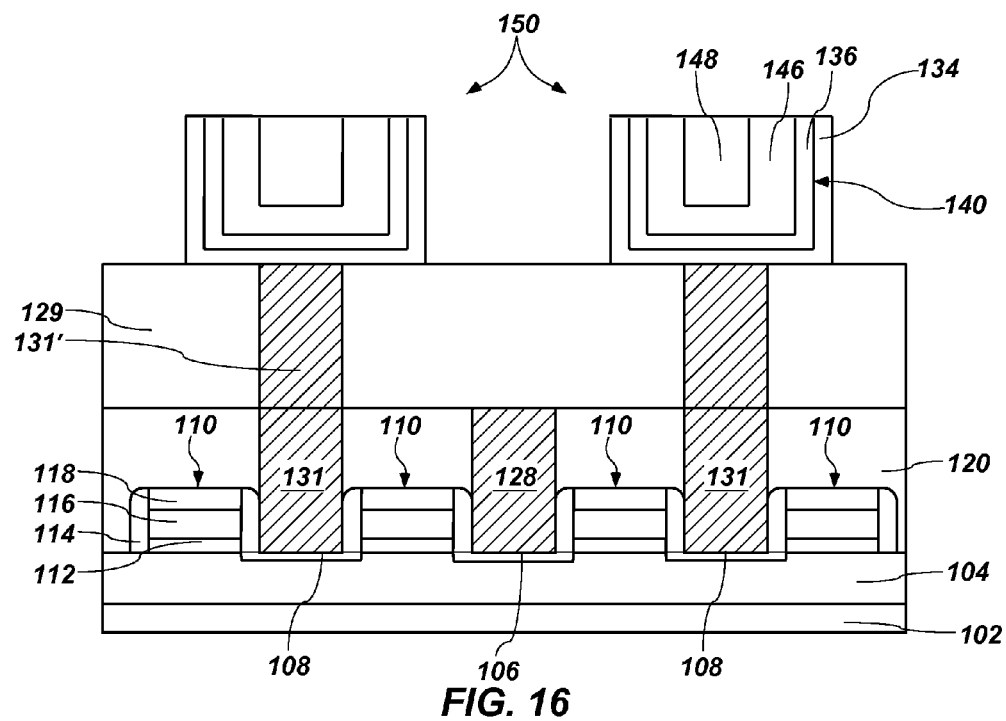
Figure 19:
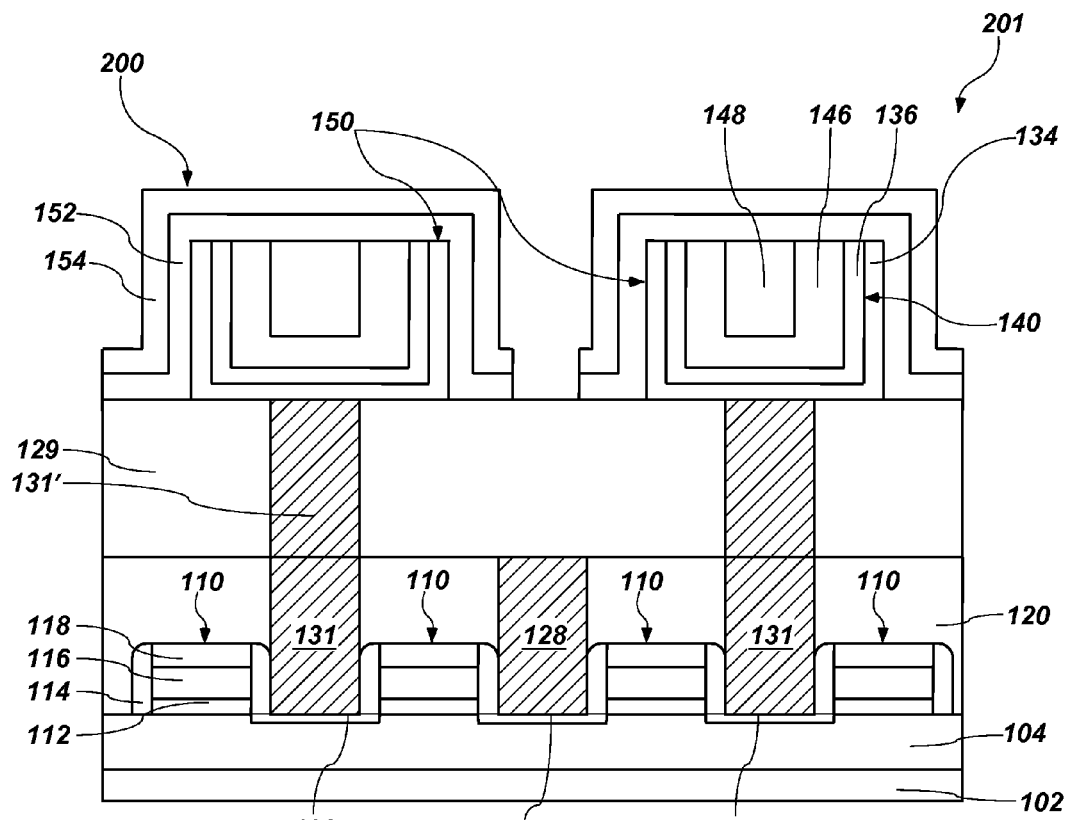

As shown in FIG. 15, the refractory metal nitride materials 134, 136, 146, 148 may be patterned, as known in the art, to expose the third insulating material 130 using, for example, a CMP process, a dry etch, or both. Since each of the metal nitride materials 134, 136, 146, 148 is conformally deposited, the metal nitride materials 134, 136, 146, 148, after patterning, may be substantially U-shaped. As shown in FIG. 16, the third insulating material 130 may be removed, producing a stud including metal nitride materials 134, 136, 146, 148. This stud constitutes the bottom electrode 150 of the MIM capacitor 200 (FIG. 19).

Because the bottom electrode 150 includes multiple metal nitride materials 134, 136, 146, 148, which form the superlattice, the bottom electrode 150 may exhibit at least about double the hardness of a bottom electrode formed from a single metal or a single metal nitride material of an equivalent thickness. This increased hardness may prevent the bottom electrode 150 from waving or wobbling and thus help prevent potential deformation of the bottom electrode 150 and the MIM capacitor 200 (FIG. 19). In addition, because the capacitor opening 132 has a high aspect ratio, as previously described, the bottom electrode 150 formed in the capacitor opening 132 may have a small critical dimension, such as, for example, less than about 45 nm.

Figure 17:
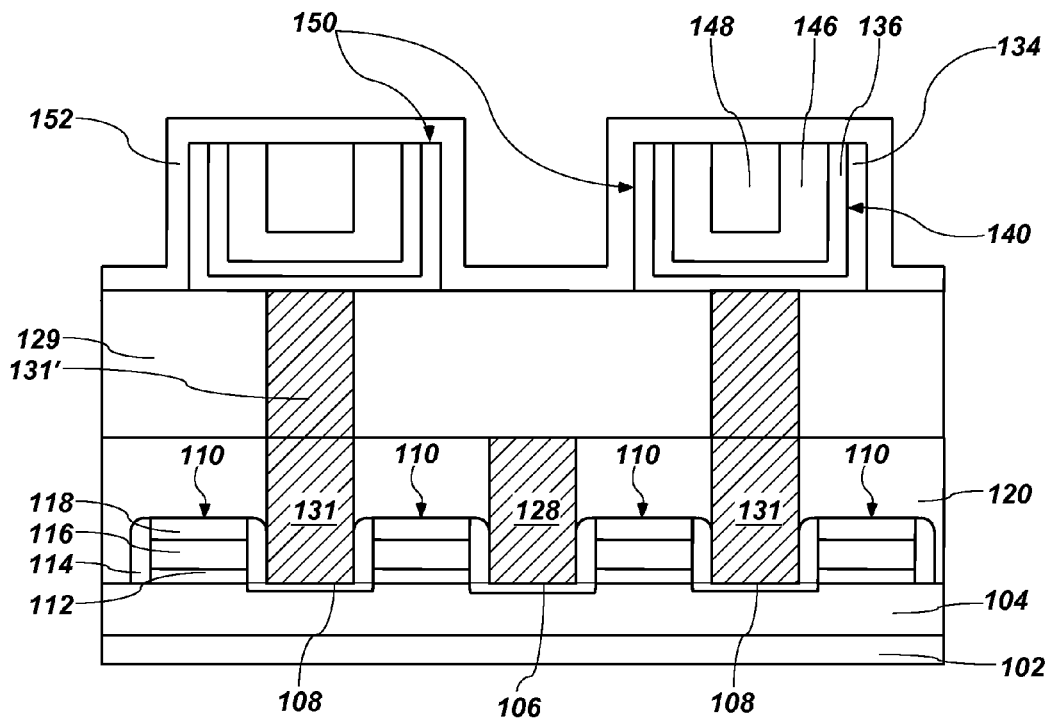

As shown in FIG. 17, a dielectric material 152 may be conformally formed over sidewalls and a horizontal surface of the bottom electrode 150 and over an exposed surface of the second insulating material 129. The dielectric material 152 may be formed from aluminum oxide ($Al_2O_3$), tantalum oxide ($Ta_2O_5$), zirconium oxide ($ZrO_2$), or hafnium oxide (HfO), as well as other dielectric materials known in the art. The dielectric material 152 may be formed by any deposition technique known in the art, such as sputtering, CVD, or PVD.

Figure 18:
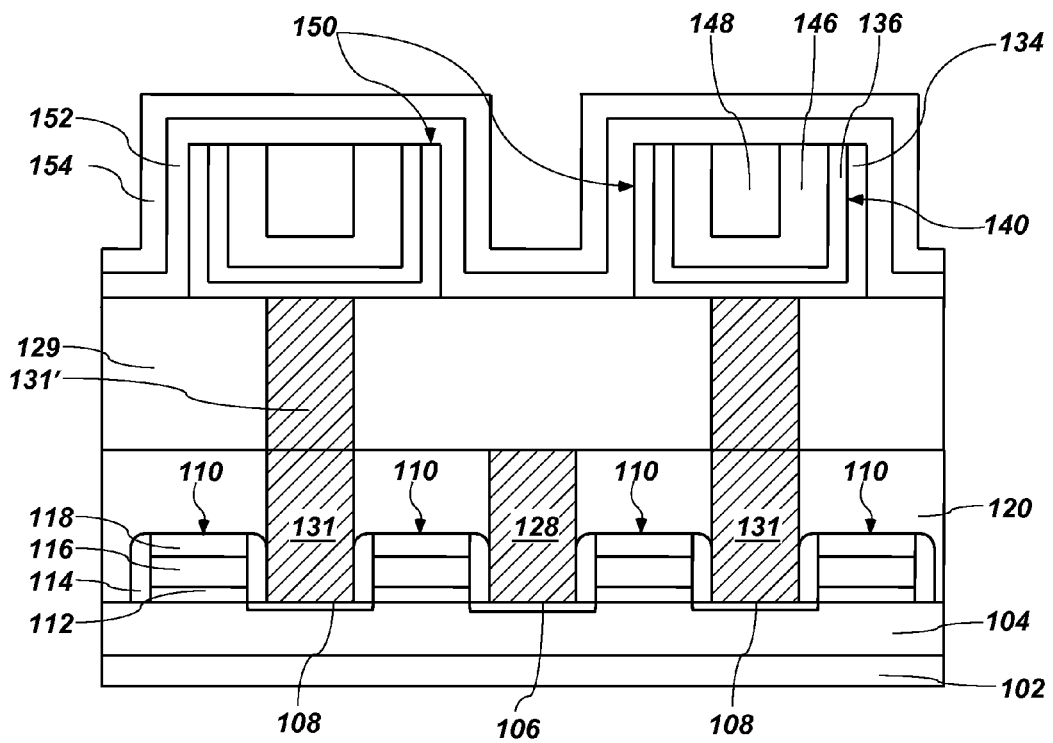

In FIG. 18, a top electrode 154 may be conformally formed in contact with the dielectric material 152. The top electrode 154 may be formed from any conductive material, such as, for example, a metal nitride. The top electrode 154 may be formed by any method known in the art, such as sputtering, CVD, or PVD. The top electrode 154 may also contain more than one portion, such as, for example, a first metal nitride material and a second metal nitride material, similar to the bottom electrode 138 formed as described in FIGS. 1-8. In FIG. 19, the dielectric material 152 and the top electrode 154 may be etched, as known in the art, to form the MIM capacitors 200.

Figure 20:
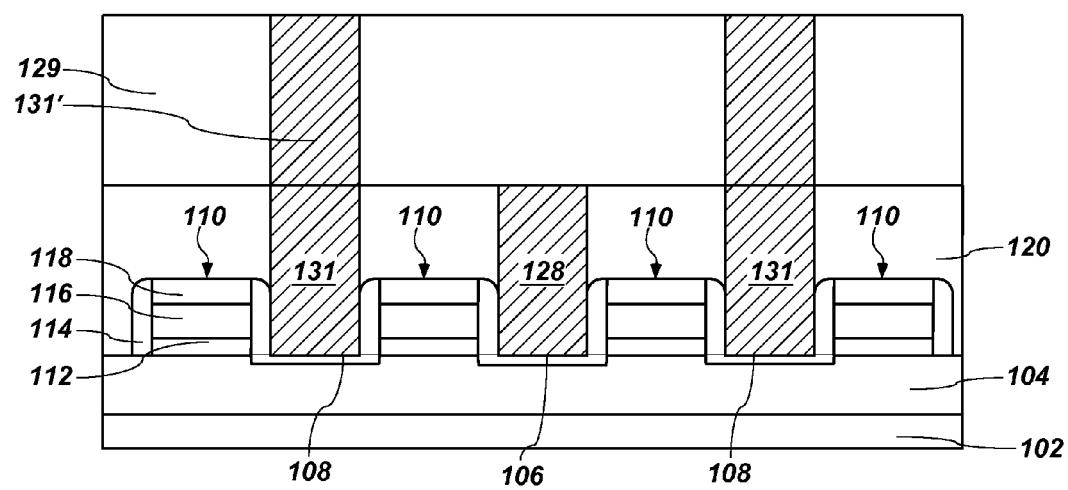
FIGS. 20-23 are cross-sectional views of a semiconductor device including a MIM capacitor during various processing acts in accordance with another embodiment of the present invention.

FIGS. 20 through 23 are cross-sectional views of a method of forming another embodiment of a semiconductor device 301 including a MIM capacitor 300 (FIG. 23) of the present invention. FIG. 20 is duplicative of FIG. 4 and may be formed according to the methods described above regarding FIGS. 1-4. As shown in FIG. 20, the second capacitor contacts 131' and the second insulating material 129 may be exposed.

Figure 21:
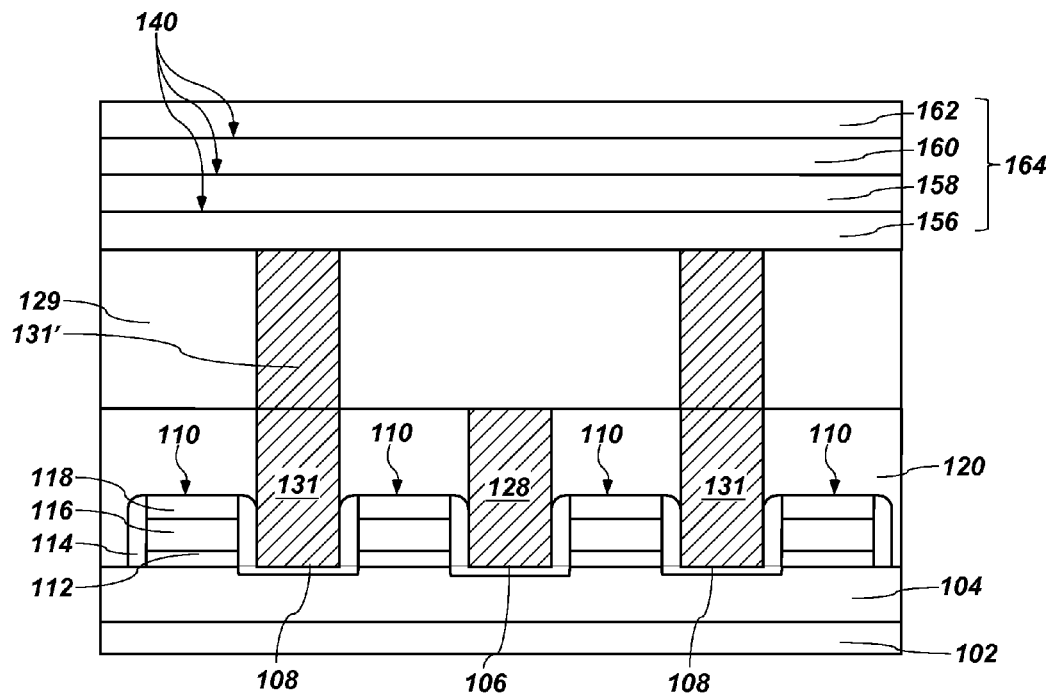

In FIG. 21, a plurality of metal nitride materials 156, 158, 160, 162 maybe formed overlying the second capacitors contact 131' and the second insulating material 129. Once patterned, as described below, the metal nitride materials 156, 158, 160, 162 may form portions of a bottom electrode 164. The metal nitride materials 156, 158, 160, 162 may be selected such that adjacent materials are formed from different metal nitride materials. By way of non-limiting example, the refractory metal in each of the metal nitride materials 156, 158, 160, and 162 may be selected so that adjacent materials contain a different refractory metal. For example, metal nitride materials 156, 160 may be formed from the same material, such as titanium nitride (TiN), and metal nitride materials 158, 162 may be formed from the same material, such as tungsten nitride (WN). Therefore, the bottom electrode 164 may be formed from multiple portions of different metal nitride materials. Each of the metal nitride materials 156, 158, 160, and 162 may have a thickness of from about 10 Å to about 40 Å, as previously described.

Figure 22:
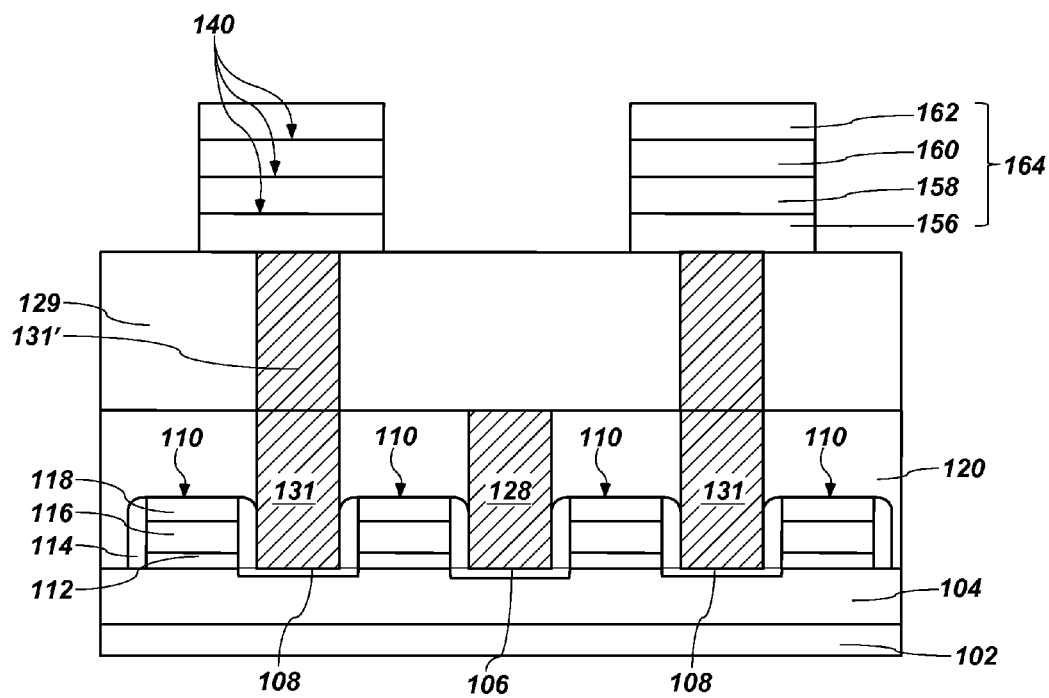
Figure 23:
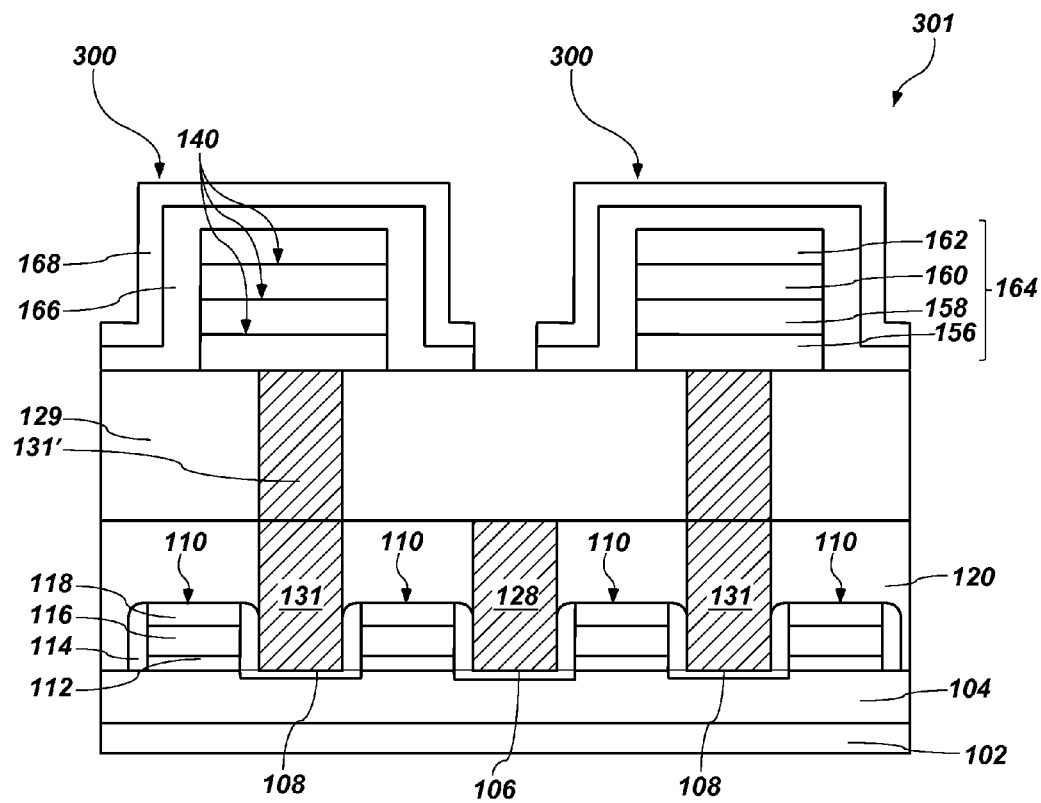

As shown in FIG. 22, the metal nitride materials 156, 158, 160, 162 may be patterned to form the bottom electrode 164. The metal nitride materials 156, 158, 160, 162 may be patterned, for example, using a dry etch. As shown in FIG. 23, a dielectric material 166 and a top electrode 168 may be formed over the bottom electrode 164 and etched to produce a MIM capacitor 300. The dielectric material 166 and the top electrode 168 may be etched, as known in the art, to electrically separate adjacent MIM capacitors 300. The dielectric material 166 may be formed from aluminum oxide ($Al_2O_3$), tantalum oxide ($Ta_2O_5$), zirconium oxide ($ZrO_2$), or hafnium oxide (HfO), as well as other dielectric materials known in the art. The dielectric material 166 may be formed by any deposition technique known in the art, such as sputtering, CVD, or PVD. The top electrode 168 may be formed from any conductive material, for example, a metal nitride. The top electrode 168 may be formed by any method known in the art, such as sputtering, CVD, or PVD. The top electrode 168 may also contain more than one portion, such as, for example a first metal nitride material and a second metal nitride material, as described above.

Because the bottom electrode 164 includes multiple metal nitride materials and has interfaces 140 between adjacent metal nitride materials, a superlattice is formed. As a result, the bottom electrode 164 exhibits at least about double the hardness of a bottom electrode formed of a single refractory metal or refractory metal nitride material. This increased hardness may prevent the bottom electrode 164 from waving or wobbling and thus help prevent potential deformation of the bottom electrode 164 and the MIM capacitor 300. In addition, the bottom electrode 164 may have a small critical dimension and a high aspect ratio, such as, for example, less than about 45 nm.

Figure 24:
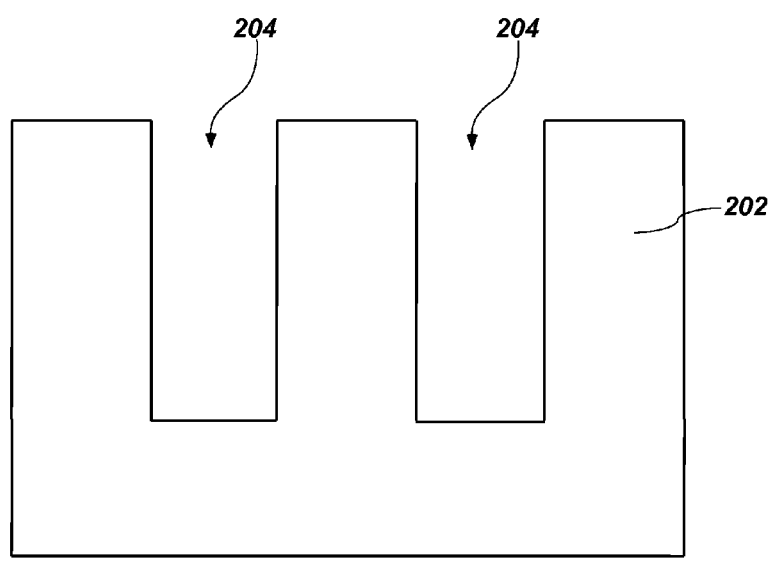
FIGS. 24-28 are cross-sectional views of a semiconductor device including an interconnect during various processing acts in accordance with one embodiment of the present invention.

FIGS. 24 through 28 are cross-sectional views of a method of forming one embodiment of a semiconductor device 401 (FIG. 28) including an interconnect 400 (FIG. 28) of the present invention. FIG. 24 depicts openings or trenches 204 formed in a substrate 202. The substrate 202 may be one of the materials previously described. The trenches 204 may be formed in the substrate 202 using conventional techniques, which are not described in detail herein. The trenches 204 may have a width of from about 10 nm to about 45 nm such that when the trenches 204 are filled, the width of the interconnect 400 may be less than about 45 nm.

Figure 25:
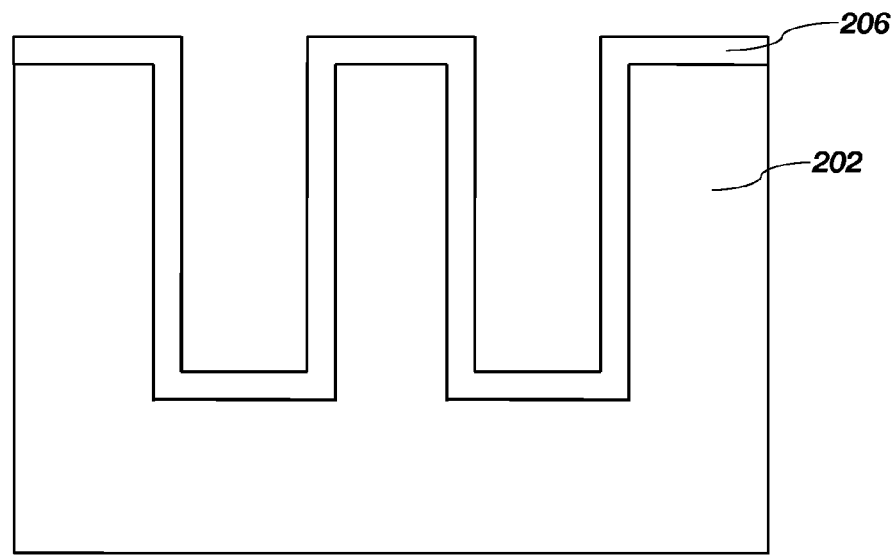

In FIG. 25, a first metal nitride material 206 may be formed in the trench 204. The first metal nitride material 206 may be conformally deposited on horizontal and vertical surfaces of the substrate 202. By way of example only, the first metal nitride material 206 may be formed from titanium nitride (TiN). The first metal nitride material 206 may be formed by a deposition technique known in the art, such as, for example, ALD, CVD, or PVD.

Figure 26:
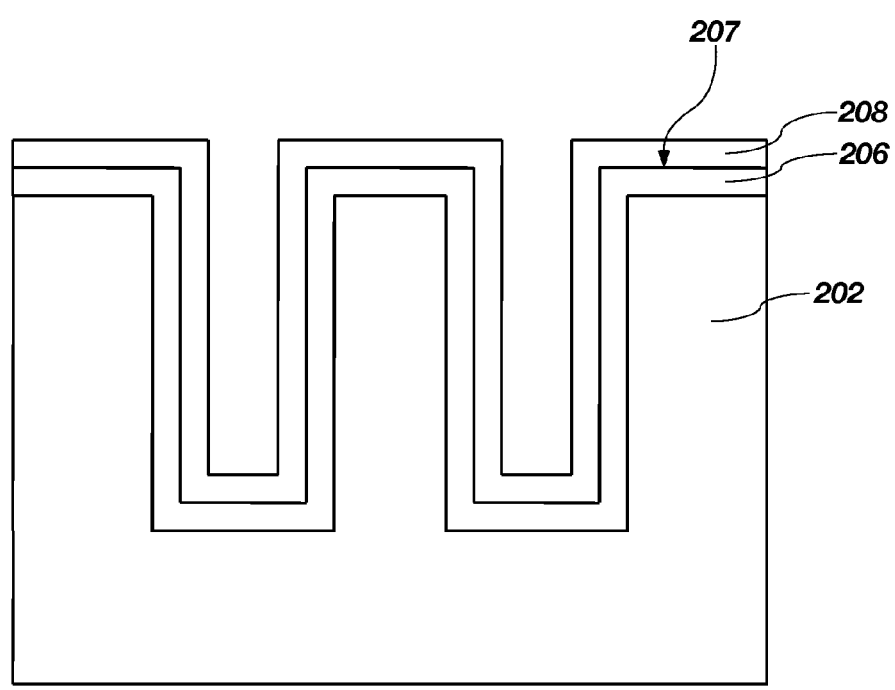

Referring to FIG. 26, a second metal nitride material 208 may be formed over and in contact with the first metal nitride material 206. The second metal nitride material 208 may be conformally deposited over the first metal nitride material 206. The first metal nitride material 206 and the second metal nitride material 208 may contact one another at an interface 207. The second metal nitride material 208 may be formed in substantially the same manner as described regarding the first metal nitride material 206. The first metal nitride material 206 and the second metal nitride material 208 may be formed from different materials, such as one of the metal nitride materials previously described. Each of the first metal nitride material 206 and the second metal nitride material 208 may be formed at a thickness of from about 10 Å to about 40 Å, as previously described. While FIG. 26 is illustrated as including a first metal nitride material 206 and a second metal nitride material 208, more than two metal nitride materials may be used to partially fill the trenches 204, with the composition of each of the metal nitride materials being different from an adjacent metal nitride material. For example, the first metal nitride material 206 may include titanium nitride (TiN) or niobium nitride (NbN) and the second metal nitride material 208 may include tungsten nitride (WN), tantalum nitride (TaN), zirconium nitride (ZrN), or hafnium nitride (HfN).

Because the first metal nitride material 206 and the second metal nitride material 208 are formed from different materials, a superlattice may be formed. As a result, the interconnect 400 formed from the first metal nitride material 206 and the second metal nitride material 208 may have at least about double the hardness of an interconnect formed from a single metal or a single metal nitride of an equivalent thickness. This increased hardness may prevent the interconnect 400 and the substrate 202 from waving or wobbling and thus help prevent potential deformation of the interconnect 400 and the substrate 202.

Figure 27:
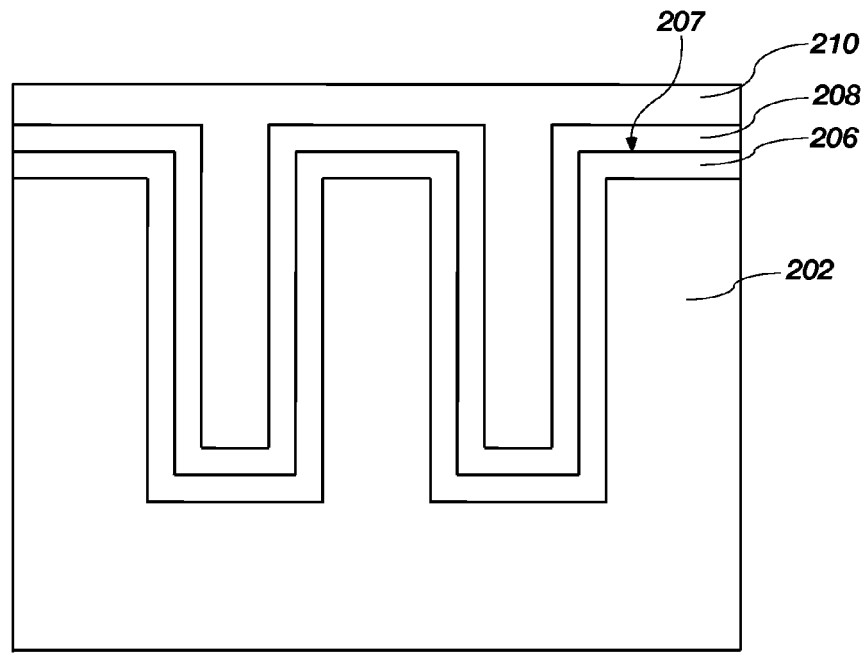

Referring to FIG. 27, a conductive material 210 may be formed over the second metal nitride material 208. The conductive material 210 may be formed of any conductive material known in the art, such as a metal or refractory metal nitride. By way of non-limiting example, the conductive material 210 may be formed from the refractory metal of the second metal nitride material 208. For example, the second metal nitride material 208 may be tungsten nitride (WN) and the conductive material 210 may be tungsten (W). The conductive material 210 may have a lower resistivity than the resistivity of the first metal nitride material 206 and the second metal nitride material 208. The conductive material 210 may be formed by any deposition technique known in the art, such as sputtering, CVD, or PVD. Forming the conductive material 210 over the first metal nitride material 206 and the second metal nitride material 208 may increase the thermal stability of the conductive material 210.

Figure 28:
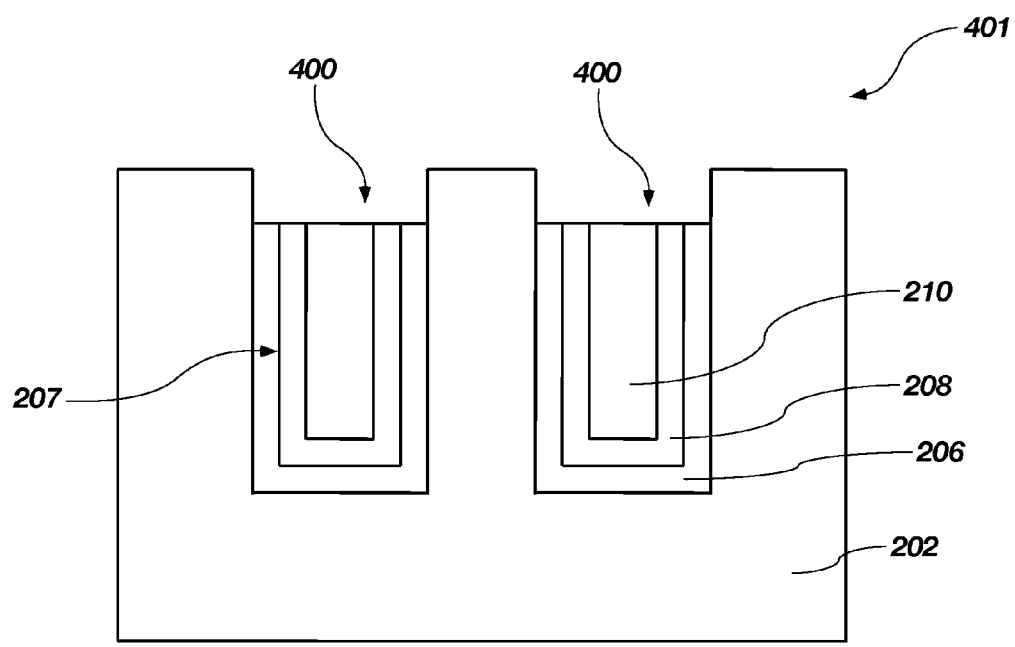

As shown in FIG. 28, the conductive material 210, the second metal nitride material 208, and the first metal nitride material 206 may be etched to or below the surface of the substrate 202 to form interconnect 400. Because the first metal nitride material 206 and the second metal nitride material 208 form a superlattice, the interconnect 400 formed in the trenches 204 may be substantially prevented from waving or wobbling.

Figure 29:
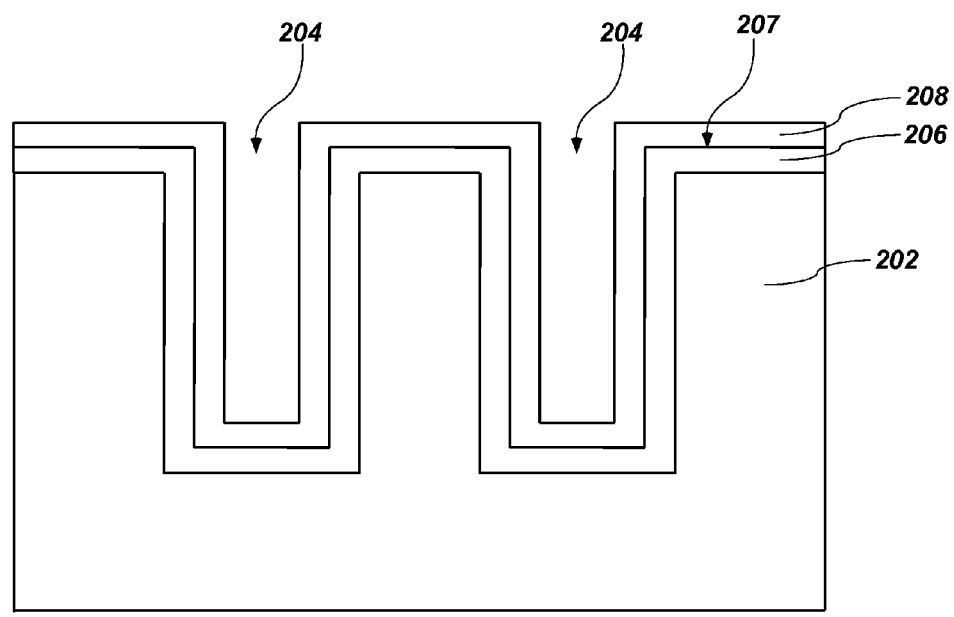
FIGS. 29-31 are cross-sectional views of a semiconductor device including an interconnect during various processing acts in accordance with another embodiment of the present invention.
Figure 30:
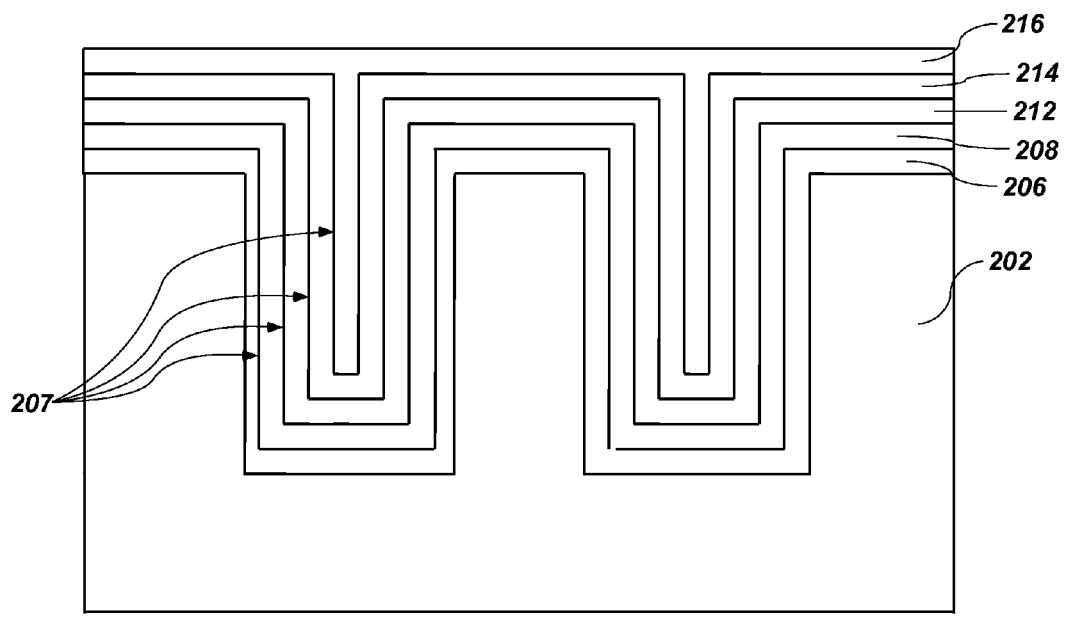
Figure 31:
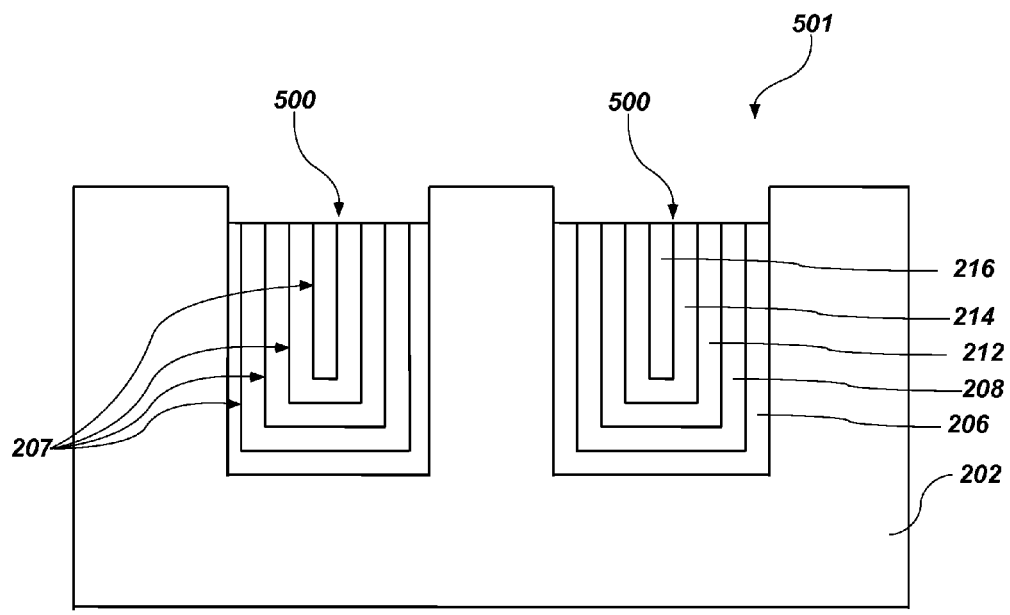

FIGS. 29 through 31 are cross-sectional views of a method of forming another embodiment of a semiconductor device 501 (FIG. 31) including an interconnect 500 (FIG. 31) of the present invention. FIG. 29 is a substantial duplication of FIG. 26 and may be formed as previously discussed regarding FIGS. 24-26. As shown in FIG. 29, the first metal nitride material 206 and the second metal nitride material 208 may be conformally formed over the substrate 202 having trenches 204 (FIG. 24) therein. The first metal nitride material 206 and the second metal nitride material 208 contact one another at the interface 207.

As shown in FIG. 30, a plurality of metal nitride materials 212, 214, 216 may be formed over the second metal nitride material 208 until the trench 204 (FIG. 24) in the substrate 202 is substantially completely filled. The metal nitride materials 212, 214, 216 may be conformally deposited over the second metal nitride material 208. The materials used as the metal nitride materials 206, 208, 212, 214, 216, respectively, may be selected so that adjacent metal nitride materials contain a different material, as previously described. For example, metal nitride materials 206, 212, 216 may be formed from titanium nitride (TiN) and metal nitride materials 208, 214 may be formed from tungsten nitride (WN). In addition to the metal nitride materials 206, 208, 212, 214, 216 including alternating materials, the metal nitride materials 206, 208, 212, 214, 216 may be selected such that adjacent metal nitride materials are formed from different materials. The metal nitride materials 212, 214, 216 may be formed in the same manner as the first metal nitride material 206 and the second metal nitride material 208, as previously described, such that a superlattice is formed. While FIG. 30 is illustrated as including five portions of metal nitride materials 206, 208, 212, 214, 216, any number of portions may be used to fill the trenches 204. Each of the metal nitride materials 206, 208, 212, 214, 216 may be formed at a thickness of from about 10 Å to about 40 Å, as previously described.

Because the metal nitride materials 206, 208, 212, 214, 216 are formed from different materials and form a superlattice, the hardness of the metal nitride materials 206, 208, 212, 214, 216 may be at least double that of a single metal nitride or refractory metal nitride material of an equivalent thickness. This increased hardness may prevent the interconnect 500 and the substrate 202 from waving or wobbling and thus help prevent potential deformation of the interconnect 500 and the substrate 202.

As shown in FIG. 31, the metal nitride materials 206, 208, 212, 214, 216, respectively, may be etched to or below the surface of the substrate 202 to form interconnect 500. The metal nitride materials 206, 208, 212, 214, 216, respectively, may be etched by conventional techniques, which are not described in detail herein.

Figure 32:
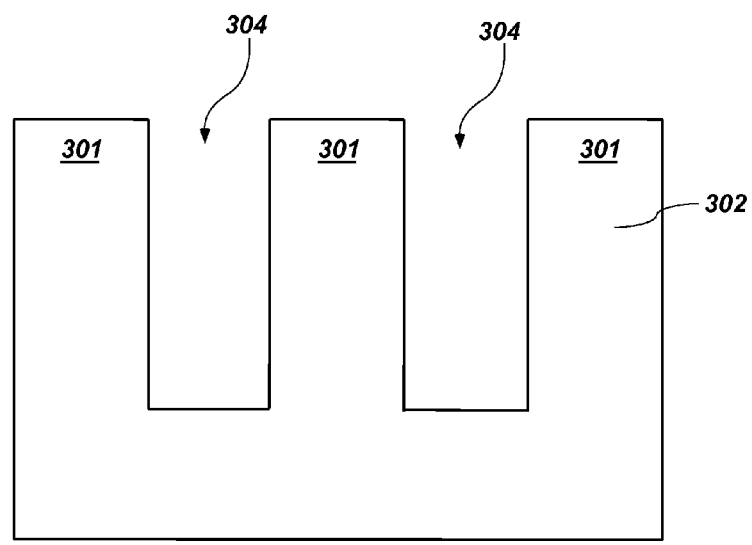
FIGS. 32-37 are cross-sectional views of a semiconductor device including a wordline during various processing acts in accordance with another embodiment of the present invention.

FIGS. 32 through 37 are cross-sectional views of a method of forming one embodiment of an interconnect including a wordline 600 of a semiconductor device 601 (FIG. 37) of the present invention. FIG. 32 depicts openings or trenches 304 formed in a substrate 302, with remaining portions of the substrate 302 forming pillars 301. The pillars 301 may have a relatively small critical dimension, such as, for example, less than about 45 nm. The substrate 302 may be a semiconductive material, such as, for example a polysilicon material. The substrate 302 may be doped to form source regions and drain regions on the substrate 302. The trenches 304 may be formed in the substrate 302 using conventional techniques, which are not described in detail herein. The trenches 304 may have a width of from about 10 nm to about 45 nm such that when the trenches 304 are filled, the width of the wordline 600 may be less than about 45 nm.

Figure 33:
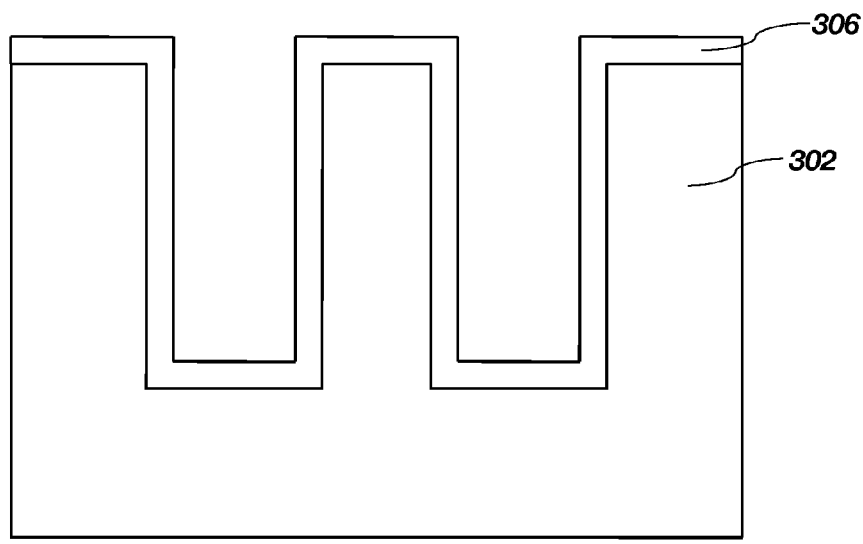
Figure 34:
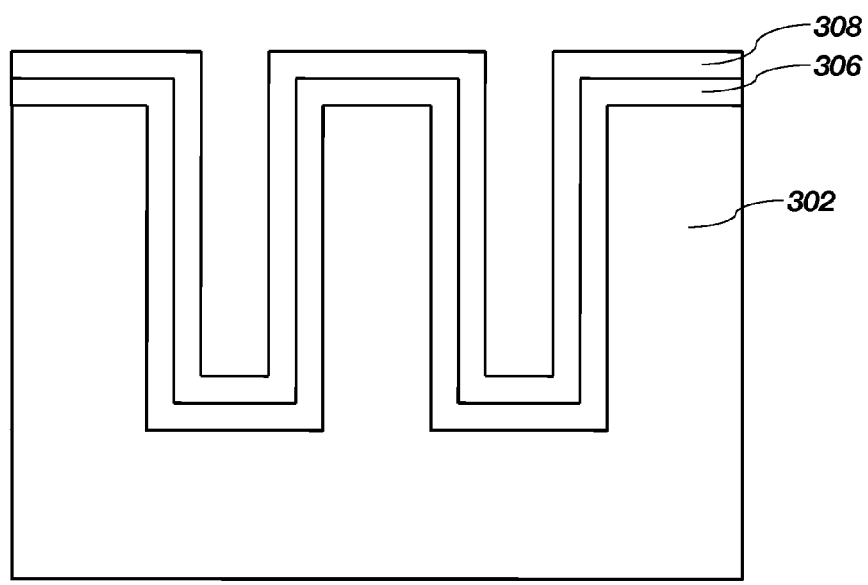

In FIG. 33, a dielectric material 306 may be formed in the trenches 304 (FIG. 32), as known in the art. The dielectric material 306 may be conformally deposited on horizontal and vertical surfaces of the substrate 302. In FIG. 34, a first metal nitride material 308 may be formed over and in contact with the dielectric material 306. By way of example only, the first metal nitride material 308 may be formed from titanium nitride (TiN). The first metal nitride material 308 may be formed by a deposition technique known in the art, such as, for example, ALD, CVD, or PVD.

Figure 35:
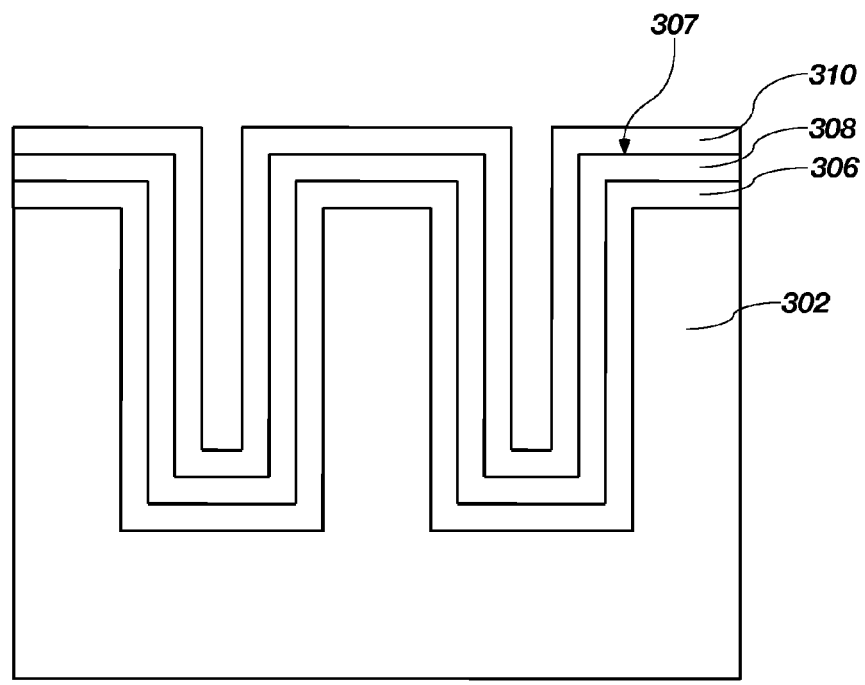

Referring to FIG. 35, a second metal nitride material 310 may be formed over and in contact with the first metal nitride material 308. The second metal nitride material 310 may be conformally deposited over the first metal nitride material 308. The first metal nitride material 308 and the second metal nitride material 310 may contact one another at an interface 307. The second metal nitride material 310 may be formed in substantially the same manner as described regarding the first metal nitride material 308. The first metal nitride material 308 and the second metal nitride material 310 may be formed from different materials, such as one of the metal nitride materials previously described. Each of the first metal nitride material 308 and the second metal nitride material 310 may be formed at a thickness of from about 10 Å to about 40 Å, as previously described. While FIG. 35 is illustrated as including a first metal nitride material 308 and a second metal nitride material 310, more than two metal nitride materials may be used to partially fill the trenches 304 (FIG. 32), with the composition of each of the metal nitride materials being different from an adjacent metal nitride material. For example, the first metal nitride material 308 may include titanium nitride (TiN) or niobium nitride (NbN) and the second metal nitride material 310 may include tungsten nitride (WN), tantalum nitride (TaN), zirconium nitride (ZrN), or hafnium nitride (HfN).

Because the first metal nitride material 308 and the second metal nitride material 310 are formed from different materials, a superlattice may be formed. As a result, the wordline 600 formed from the first metal nitride material 308 and the second metal nitride material 310 may have at least about double the hardness of an interconnect formed from a single metal or a single metal nitride material of an equivalent thickness. This increased hardness may prevent the wordline 600 and the substrate 302 from waving or wobbling and thus help prevent potential deformation of the wordline 600 and the substrate 302.

Figure 36:
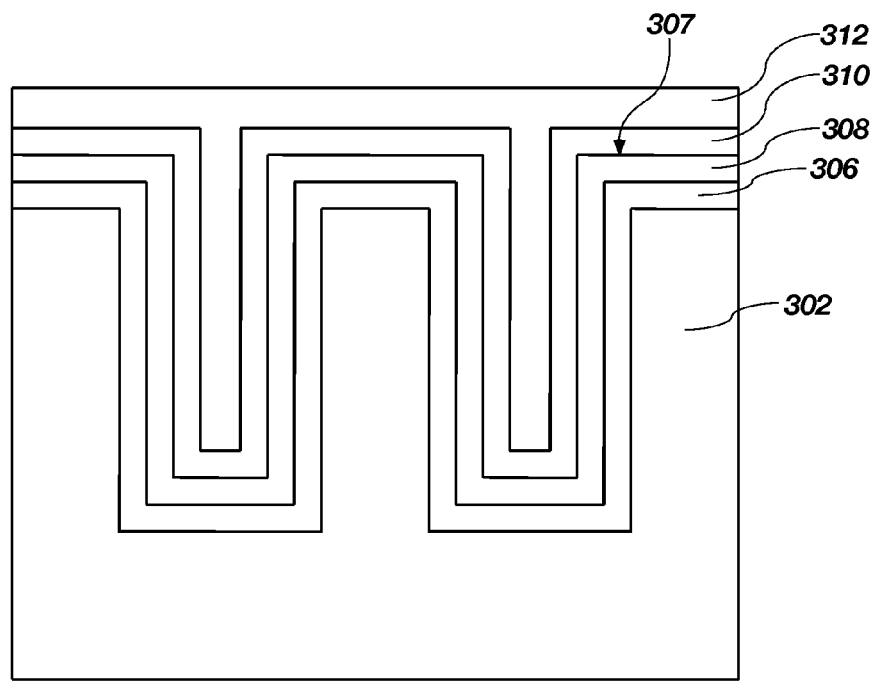

Referring to FIG. 36, a conductive material 312 may be formed over the second metal nitride material 310. The conductive material 312 may be formed of any conductive material known in the art, such as a metal or refractory metal nitride. By way of non-limiting example, the conductive material 312 may be formed from the refractory metal of the second metal nitride material 310. For example, the second metal nitride material 310 may be tungsten nitride (WN) and the conductive material 312 may be tungsten (W). The conductive material 312 may have a lower resistivity than the resistivity of the first metal nitride material 308 and the second metal nitride material 310. The conductive material 312 may be formed by any deposition technique known in the art, such as sputtering, CVD, or PVD. Forming the conductive material 312 over the first metal nitride material 308 and the second metal nitride material 310 may increase the thermal stability of the conductive material 312.

Figure 37:
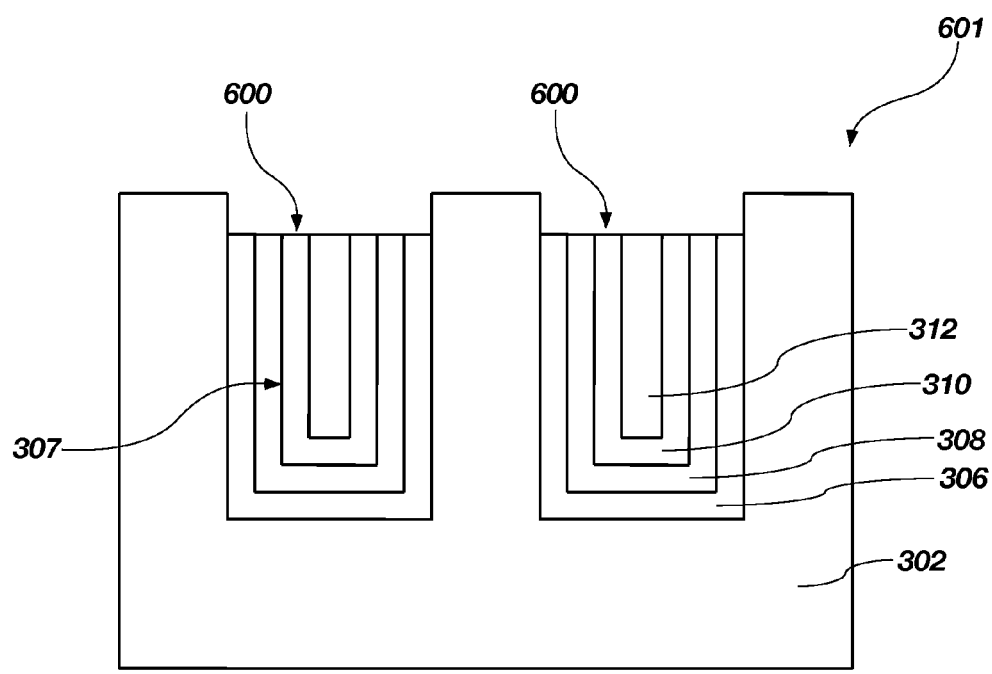

As shown in FIG. 37, the conductive material 312, the second metal nitride material 310, and the first metal nitride material 308 may be etched to or below the surface of the substrate 302 to form wordline 600.

Figure 38:
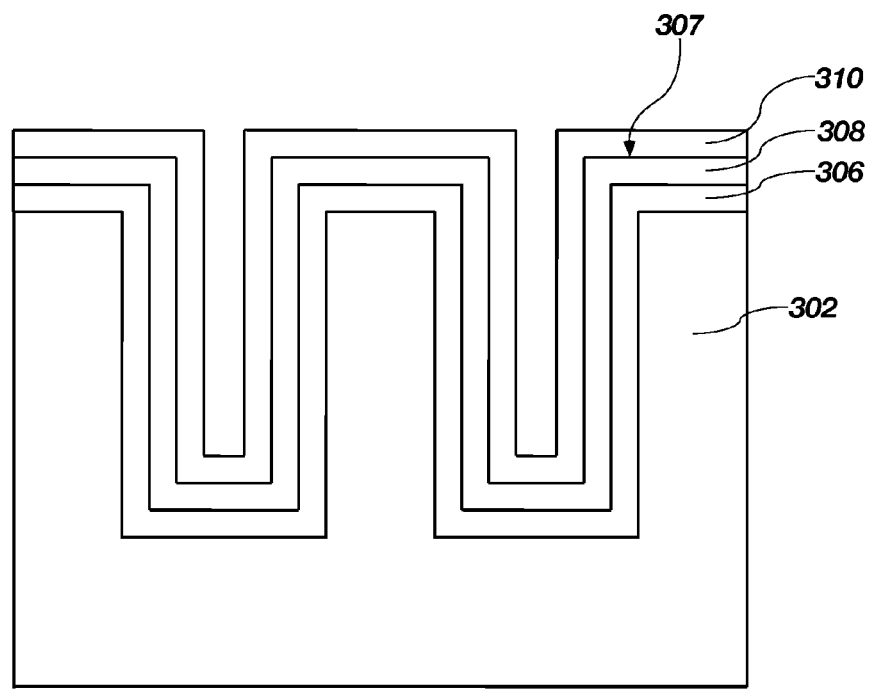
FIGS. 38-40 are cross-sectional views of a semiconductor device including a wordline during various processing acts in accordance with another embodiment of the present invention.
Figure 39:
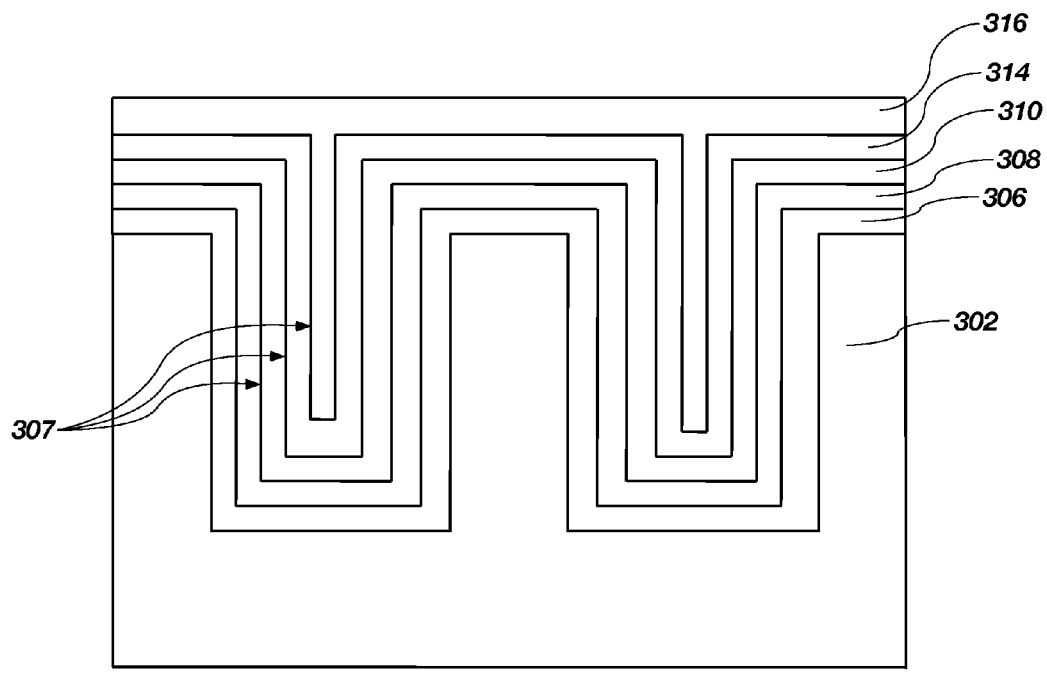
Figure 40:
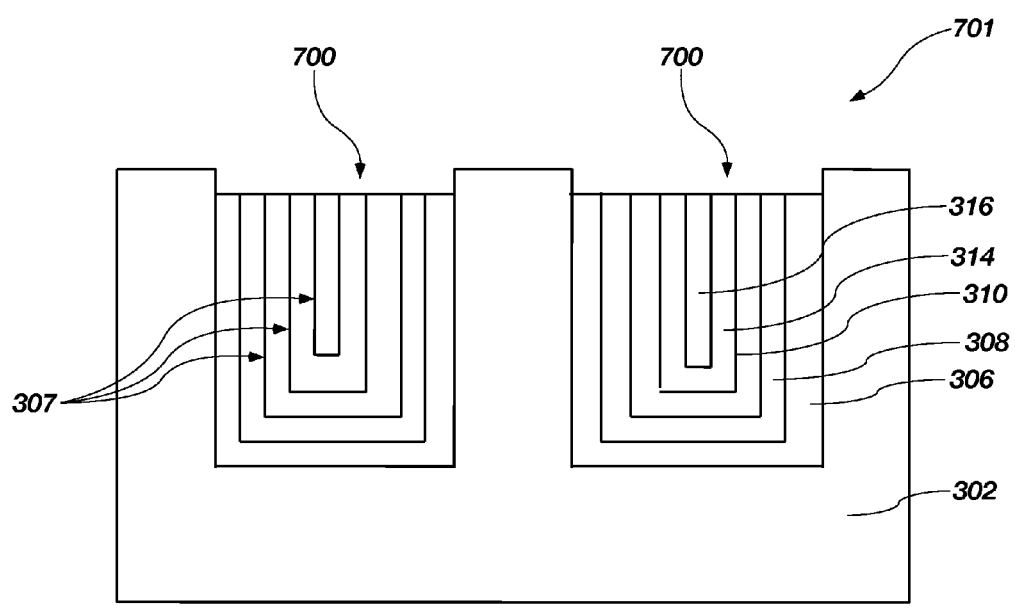

FIGS. 38 through 40 are cross-sectional views of a method of forming another embodiment of an interconnect including a wordline 700 (FIG. 40) of a semiconductor device 701 of the present invention. FIG. 38 is a substantial duplication of FIG. 35 and may be formed as previously discussed regarding FIGS. 32-35. As shown in FIG. 38, the dielectric material 306, first metal nitride material 308 and the second metal nitride material 310 may be conformally formed over the substrate 302 having trenches 304 (FIG. 32) therein. The first metal nitride material 308 and the second metal nitride material 310 contact one another at the interface 307 (FIG. 35).

As shown in FIG. 39, a plurality of metal nitride materials 314, 316 maybe formed over the second metal nitride material 310 until the trench 304 (FIG. 32) in the substrate 302 is substantially completely filled. The metal nitride materials 314, 316 may be conformally deposited over the second metal nitride material 310. The materials used as the metal nitride materials 308, 310, 314, 316 may be selected so that adjacent metal nitride materials contain a different material, as previously described. For example, metal nitride materials 308, 314 may be formed from titanium nitride (TiN) and metal nitride materials 310, 316 may be formed from tungsten nitride (WN). In addition to the metal nitride materials 308, 310, 314, 316 including alternating materials, the metal nitride materials 308, 310, 314, 316 may be selected such that adjacent metal nitride materials are formed from different materials. The metal nitride materials 314, 316 may be formed in the same manner as the first metal nitride material 308 and the second metal nitride material 310, as previously described, such that a superlattice is formed. While FIG. 39 is illustrated as including four portions of metal nitride materials 308, 310, 314, 316 any number of portions may be used to fill the trenches 304. Each of the metal nitride materials 308, 310, 314, 316 may be formed at a thickness of from about 10 Å to about 40 Å, as previously described.

Because the metal nitride materials 308, 310, 314, 316 are formed from different materials and form a superlattice, the hardness of the metal nitride materials 308, 310, 314, 316 may be at least double that of a single metal nitride or refractory metal nitride material of an equivalent thickness. This increased hardness may prevent the wordline 700 and the substrate 302 from waving or wobbling and thus help prevent potential deformation of the wordline 700 and the substrate 302.

As shown in FIG. 40, the metal nitride materials 308, 310, 314, 316, respectively, may be etched to or below the surface of the substrate 302 to form wordline 700. The metal nitride materials 308, 310, 314, 316, respectively, may be etched by conventional techniques, which are not described in detail herein.

Figure 41:
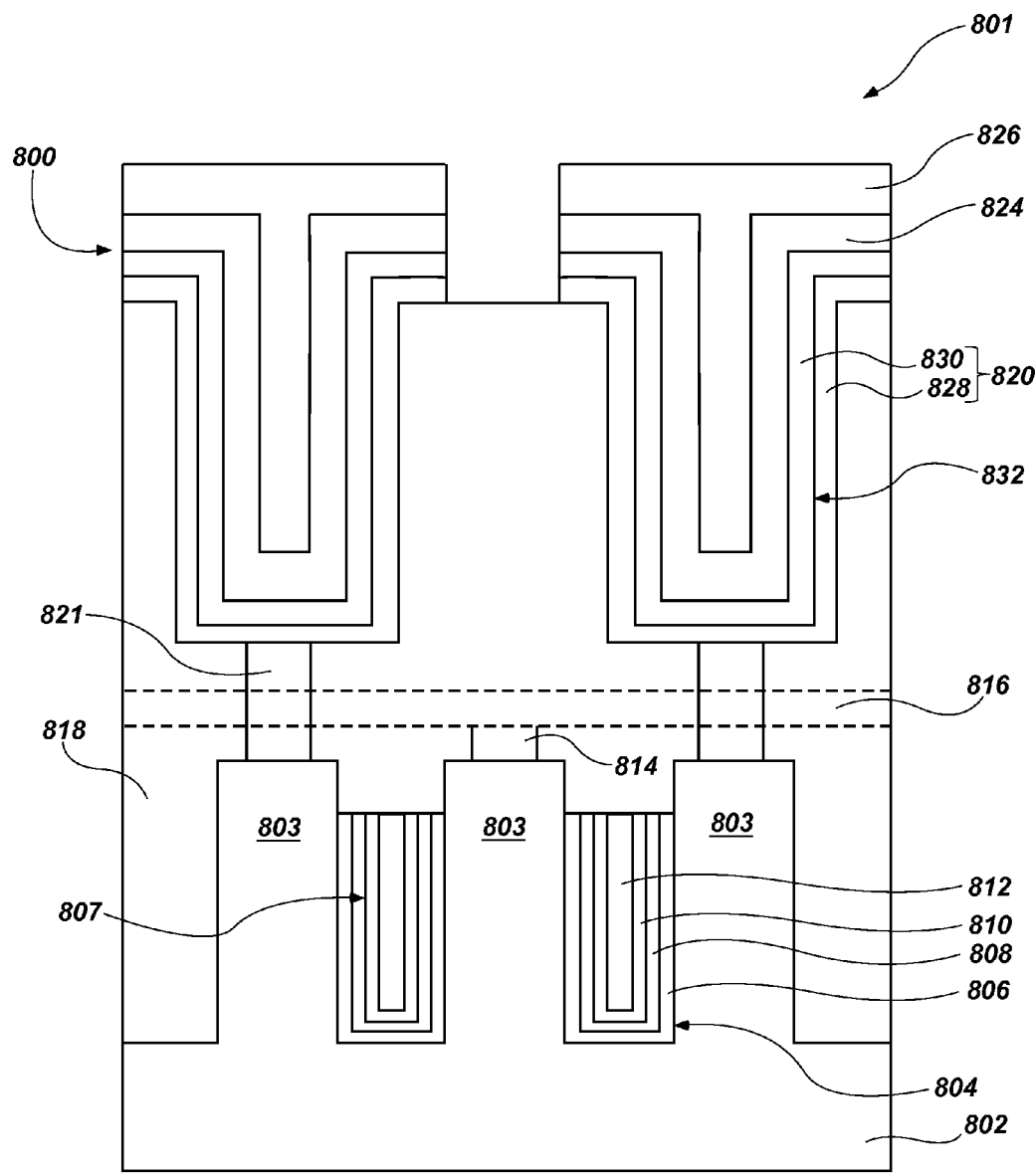
FIG. 41 is a cross-sectional view of a semiconductor device including a MIM capacitor and a wordline of the present invention.

The MIM capacitors 100, 200, 300 and the wordlines 600, 700 described herein may also be utilized in a single semiconductor device as known in the art. For example, FIG. 41 illustrates one embodiment of a semiconductor device 801 including a buried wordline 804 including at least two portions of metal nitride material 808, 810 and a MIM capacitor 800 having a bottom electrode 820 formed of at least two portions of a metal nitride material 828, 830. The buried wordline 804 may include, for example, a dielectric material 806, a first metal nitride material 808, a second metal nitride material 810, and a conductive material 812 formed within a trench formed in a substrate 802. A crystal superlattice may be formed at an interface 807 between the first metal nitride material 808 and the second metal nitride material 810. The buried wordline 804 may be formed in a manner analogous to that described above in regard to FIGS. 32-37 or FIGS. 38-40.

A bitline contact 814 may be formed on pillars 803 of the substrate 802 between two wordlines 804. A bitline 816 may be formed in electrical communication with the bitline contact 814 as known in the art. The bitline 816 is illustrated as a dashed line in FIG. 41, indicating the bitline 816 may be formed in a different plane than the MIM capacitor 800.

An insulating material 818 and a capacitor contact 821 may also be formed on the pillars 803 of the substrate 802 by conventional techniques, which are not described in detail herein. The MIM capacitor 800 may be formed in the insulating material 818 in a manner analogous to that described above in regard to FIGS. 6-11. The MIM capacitor 800 may include, for example, a bottom electrode 820, a dielectric material 824, and a top electrode 826. The bottom electrode 820 may include a first metal nitride material 828 and a second metal nitride material 830. A superlattice may be formed at the interface 832 between the first metal nitride material 828 and the second metal nitride material 830. The MIM capacitor 800 may be formed in a manner analogous to that described above in regard to FIGS. 6-11, FIGS. 12-19, or FIGS. 20-23.

Because the first and second metal nitride materials 808, 810 in the wordline 804 and the metal nitride materials 828, 830 in the MIM capacitor 800 form superlattices, the hardness of the wordline 804 and the bottom electrode 820 may be at least double that of a single metal nitride or refractory metal nitride material of an equivalent thickness. As such, the semiconductor device 801 may be less susceptible to potential deformation due to wobbling or wavering of the various components of the semiconductor device 801.

In addition to the MIM capacitors and interconnects including the metal nitride/metal nitride structures described above, MIM capacitors and interconnects including metal nitride/metal structures may also be formed. The metal nitride/metal structures may be formed by utilizing a first metal nitride material 134, as described above, and a metal in place of the second metal nitride material 136. By way of non-limiting example, the metal may be used in place of second metal nitride material 136 in FIG. 8, second metal nitride material 136 in FIG. 12, fourth metal nitride material 148 in FIG. 14, metal nitride materials 158 or 162 in FIG. 21, second metal nitride material 208 in FIG. 26, second metal nitride material 208, and nitride metal material 214 in FIG. 30, second metal nitride material 310 in FIG. 35, or second metal nitride material 310 and nitride material 316 in FIG. 39. The metal may be a refractory metal, such as tungsten or molybdenum. The metal may be formed by conventional techniques, which are not described in detail herein.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the scope of the invention as defined by the following appended claims and their legal equivalents.

What is claimed is:

1. A capacitor comprising:
   a bottom electrode comprising at least two portions, each portion of the bottom electrode comprising a metal nitride material, at least one of the portions of the bottom electrode comprising a different metal nitride material than another portion of the bottom electrode, the at least two portions of the bottom electrode comprising a superlattice, the at least two portions of the bottom electrode comprising at least substantially the same crystal structure, and the metal nitride material of at least one of the at least two portions of the bottom electrode comprising a gradient of nitrogen therethrough;
   a dielectric material in contact with the bottom electrode; and
   a top electrode in contact with the dielectric material.

2. The capacitor of claim 1, wherein the bottom electrode is at least twice as hard as a single metal nitride material of equivalent thickness.

3. The capacitor of claim 1, wherein the bottom electrode has an aspect ratio of at least 30:1.

4. The capacitor of claim 1, wherein the metal nitride material comprises a material selected from the group consisting of tungsten nitride, molybdenum nitride, niobium nitride, tantalum nitride, rhenium nitride, titanium nitride, vanadium nitride, chromium nitride, zirconium nitride, and hafnium nitride.

5. The capacitor of claim 1, wherein at least one portion of the at least two portions of the bottom electrode comprises titanium nitride and at least one other portion of the at least two portions of the bottom electrode comprises tungsten nitride.

6. The capacitor of claim 1, wherein each of the at least two portions of the bottom electrode comprises a thickness of from approximately 5 angstroms to approximately 300 angstroms.

7. The capacitor of claim 1, wherein each of the at least two portions of the bottom electrode comprises a thickness of from approximately 10 angstroms to approximately 40 angstroms.

8. The capacitor of claim 1, further comprising an interface of two of the at least two portions of the bottom electrode, the interface comprising a gradient of nitrogen therethrough.

9. A capacitor comprising:
   a bottom electrode in an opening having a height to width ratio exceeding approximately 30:1, the bottom electrode comprising a plurality of portions of a metal nitride material, each adjacent portion of the plurality of portions of the metal nitride material comprising a different metal nitride material, at least one portion of the plurality of portions comprising a gradient of nitrogen therethrough;
   a dielectric material in contact with the bottom electrode; and
   a top electrode in contact with the dielectric material.

10. The capacitor of claim 9, wherein the bottom electrode comprises alternating portions of niobium nitride and tungsten nitride.

11. The capacitor of claim 9, wherein each of the metal nitride materials of the bottom electrode is substantially linear.

12. The capacitor of claim 9, wherein the bottom electrode comprises at least four portions of alternating metal nitride materials.

13. The capacitor of claim 9, wherein each of the plurality of portions of the metal nitride materials of the bottom electrode is substantially U-shaped.

14. The capacitor of claim 9, wherein the top electrode comprises alternating portions of at least two metal nitride materials.

15. The capacitor of claim 9, wherein at least one of the plurality of portions of the metal nitride material comprises a crystal structure with less than an approximately 30% mismatch from a crystal structure of at least one other of the adjacent portions of the plurality of portions of the metal nitride material.

16. A semiconductor device comprising:
   a first contact on at least one source region on a substrate;
   a bottom electrode directly on and in physical contact with the first contact, the bottom electrode comprising at least two portions, each portion of the bottom electrode comprising a metal nitride material, at least one of the at least two portions of the bottom electrode comprising a different metal nitride material than another portion of the bottom electrode, at least one of the at least two portions of the bottom electrode comprising a gradient of nitrogen therethrough, the bottom electrode in an opening comprising a height to width ratio exceeding approximately 30:1;
   a dielectric material in contact with the bottom electrode; and
   a top electrode in contact with the dielectric material.

17. The semiconductor device of claim 16, further comprising a second contact formed between the first contact and the bottom electrode.

18. The semiconductor device of claim 16, wherein the metal nitride material of at least one of the at least two portions of the bottom electrode comprises homogenously distributed nitrogen.

19. A method of forming a capacitor, comprising:
 forming a plurality of metal nitride materials on a contact, each metal nitride material of the plurality of metal nitride materials formed from a different material than an adjacent metal nitride material, and at least one of the plurality of metal nitride materials comprising a gradient of nitrogen therethrough, wherein forming the plurality of metal nitride materials on the contact comprises:
  forming a metal nitride material of the plurality of metal nitride materials on the contact; and
  forming the adjacent metal nitride material on the metal nitride material, the adjacent metal nitride material exhibiting a crystal structure substantially the same as a crystal structure of the metal nitride material;
 forming a dielectric material in contact with the plurality of metal nitride materials; and
 forming a top electrode in contact with the dielectric material.

20. The method of claim 19, wherein forming a plurality of metal nitride materials comprises forming a plurality of metal nitride materials in an opening in an insulating material.

21. The method of claim 20, wherein forming a plurality of metal nitride materials in an opening in an insulating material comprises conformally depositing each of the plurality of metal nitride materials to substantially fill the opening.

22. The method of claim 20, further comprising removing the insulating material to form a stud comprising the plurality of metal nitride materials.

23. The method of claim 20, wherein forming a plurality of metal nitride materials in an opening in an insulating material comprises conformally depositing each of the plurality of metal nitride materials to partially fill the opening.

24. The method of claim 19, further comprising patterning the plurality of metal nitride materials to form at least one stud comprising the plurality of metal nitride materials.

25. The method of claim 20, wherein forming a plurality of metal nitride materials in an opening in an insulating material comprises forming the plurality of metal nitride materials in an opening having a height to the width ratio of at least 30:1.

* * * * *